United States Patent
Blatchford et al.

(10) Patent No.: US 9,305,848 B2
(45) Date of Patent: Apr. 5, 2016

(54) ELONGATED CONTACTS USING LITHO-FREEZE-LITHO-ETCH PROCESS

(71) Applicant: Texas Instruments Incorporated, Dallas, TX (US)

(72) Inventors: James Walter Blatchford, Richardson, TX (US); Scott William Jessen, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/572,891

(22) Filed: Dec. 17, 2014

(65) Prior Publication Data

US 2015/0170975 A1    Jun. 18, 2015

Related U.S. Application Data

(60) Provisional application No. 61/916,851, filed on Dec. 17, 2013.

(51) Int. Cl.
| | |
|---|---|
| *H01L 21/8238* | (2006.01) |
| *H01L 21/8234* | (2006.01) |
| *H01L 21/762* | (2006.01) |
| *H01L 21/768* | (2006.01) |
| *H01L 21/311* | (2006.01) |
| *H01L 21/027* | (2006.01) |

(52) U.S. Cl.
CPC .. *H01L 21/823871* (2013.01); *H01L 21/31144* (2013.01); *H01L 21/762* (2013.01); *H01L 21/76802* (2013.01); *H01L 21/76831* (2013.01); *H01L 21/76879* (2013.01); *H01L 21/823475* (2013.01); *H01L 21/0273* (2013.01)

(58) Field of Classification Search
CPC ............ H01L 21/31144; H01L 21/762; H01L 21/76802; H01L 21/76831; H01L 21/76879; H01L 21/823475; H01L 21/823871; H01L 21/0273

USPC .................................................. 438/219, 295
See application file for complete search history.

(56) References Cited

U.S. PATENT DOCUMENTS

| | | | | |
|---|---|---|---|---|
| 6,017,813 | A * | 1/2000 | Kuo ...................... | H01L 23/485 257/E21.646 |
| 7,354,855 | B2 * | 4/2008 | Hotta ................. | H01L 21/76808 257/E21.508 |
| 7,678,692 | B2 * | 3/2010 | Chen .................. | H01L 21/76885 438/624 |
| 2001/0045651 | A1 * | 11/2001 | Saito ................. | H01L 21/28518 257/750 |
| 2003/0032284 | A1 * | 2/2003 | Enomoto .......... | H01L 21/31116 438/687 |
| 2010/0052116 | A1 * | 3/2010 | Cooper ............... | H01L 21/2885 257/653 |

* cited by examiner

*Primary Examiner* — Thanh T Nguyen
(74) *Attorney, Agent, or Firm* — Jacqueline J. Garner; Frank D. Cimino

(57) ABSTRACT

A process of forming an integrated circuit containing elongated contacts which connect to three active areas and/or MOS gates, and elongated contacts which connect to two active areas and/or MOS gates and directly connect to a first level interconnect, using a litho-freeze-litho-etch process for a contact etch mask. A process of forming an integrated circuit containing elongated contacts which connect to three active areas and/or MOS gates, and elongated contacts which connect to two active areas and/or MOS gates and directly connect to a first level interconnect, using a litho-freeze-litho-etch process for a first level interconnect trench etch mask. A process of forming the integrated circuit using a litho-freeze-litho-etch process for a contact etch mask and a litho-freeze-litho-etch process for a first level interconnect trench etch mask.

20 Claims, 27 Drawing Sheets

ELONGATED CONTACTS USING LITHO-FREEZE-LITHO-ETCH PROCESS

CROSS-REFERENCE TO RELATED APPLICATIONS

This application claims the benefit of priority under U.S.C. §119(e) of U.S. Provisional Application 61/916,851 (Texas Instruments docket number TI-69284P), filed Dec. 17, 2013, which is hereby incorporated by reference in its entirety.

The following co-pending patent application is related and hereby incorporated by reference: U.S. patent application Ser. No. 14/572,905, filed concurrently with this application.

FIELD OF THE INVENTION

This invention relates to the field of integrated circuits. More particularly, this invention relates to interconnects in integrated circuits.

BACKGROUND OF THE INVENTION

Contacts and first level interconnects in integrated circuits may be formed by photolithographically defining areas to be etched. For example, contacts may be formed by exposing contact areas in a contact photosensitive layer, followed by developing the contact photosensitive layer to form a contact etch mask, and subsequently etching a dielectric layer to form contact holes and filling the contact holes with contact metal. Similarly, metal first level interconnects may be formed above the contacts by exposing interconnect areas in an interconnect photosensitive layer, followed by developing the first level interconnect photosensitive layer to form a trench etch mask. It may be desirable to use photolithographic equipment to expose the contact photosensitive layer and the interconnect photosensitive layer which has a spatial resolution limit which is larger than the separation between some contacts and/or some first level interconnects, for example in instances in which photolithographic equipment with a smaller spatial resolution limit is more expensive.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be fabricated by forming a contact etch pattern in two exposure operations and/or by forming a first trench etch pattern in two exposure operations, using litho-freeze-litho-etch processes. In a litho-freeze-litho-etch process, a first subpattern is produced by exposing and developing a first photosensitive layer, followed by treating the first subpattern so that it remains intact during a subsequent photolithography process sequence. A second photosensitive layer is formed on the integrated circuit and a second exposure and develop sequence is performed to produce a second subpattern. The first subpattern in combination with the second subpattern provide an etch mask. A contact etch mask is used to form contacts which include elongated contacts, that is, contacts which connect to more than one active area or MOS transistor gate, which are not in memory cells. A first interconnect trench etch mask is used to form metal first level interconnects immediately above the contacts. Elongated contacts which connect to exactly two active areas and/or MOS gates also directly connect to first level interconnects.

DETAILED DESCRIPTION OF EXAMPLE EMBODIMENTS

Figure 1A:
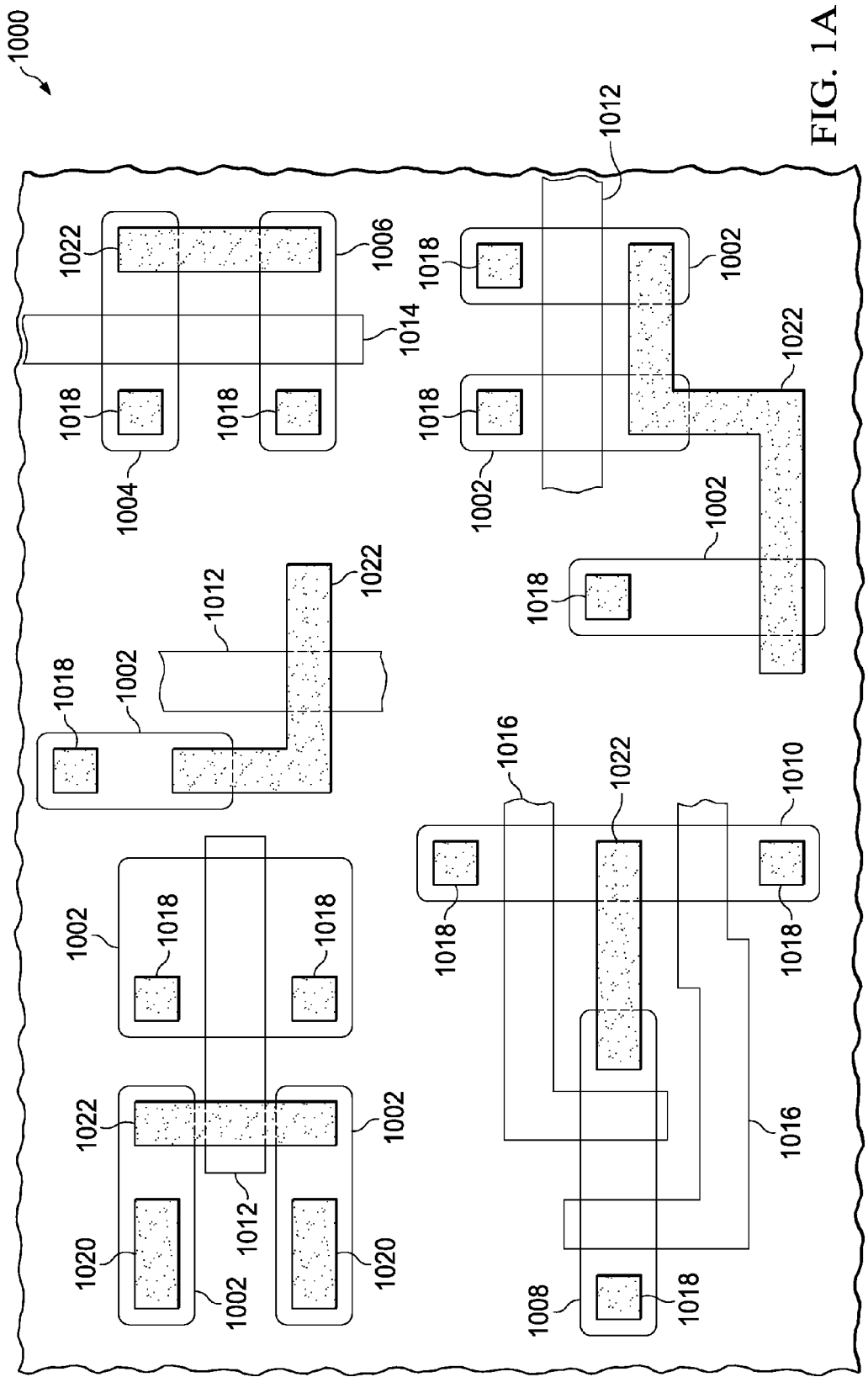
FIG. 1A through FIG. 1H are top views of an integrated circuit formed according to an example, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this description, the term "contacts" is understood to refer to metal elements which connect to active areas and/or metal oxide semiconductor (MOS) transistor gates, hereafter referred to as MOS gates, in an integrated circuit. Active areas and/or MOS gates may include a layer of metal silicide, such that the contacts touch the metal silicide layer. MOS gates include contiguous gate material over field oxide.

An integrated circuit may be formed by performing two cycles of exposing and developing contact etch submasks using a litho-freeze-litho-etch process. An optional contact hard mask layer may be used in the fabrication sequence. The contacts include elongated contacts, which are contacts which connect to more than one active area or MOS gate in the integrated circuit, which are not in memory cells. Damascene first level interconnects immediately above the contacts may be formed by forming an intra metal dielectric (IMD) layer above the contacts, and performing two cycles of exposing and developing trench etch submask using a litho-freeze-litho-etch process. An optional trench hard mask layer may be used in the fabrication sequence. Interconnect trenches are etched in the IMD layer through the interconnect trench hard mask layer. The interconnect trenches are filled with interconnect material such as a liner metal and copper fill metal. Elongated contacts which connect to exactly two active area and/or MOS gates also directly connect to first level interconnect elements.

FIG. 1A through FIG. 1H are top views of an integrated circuit formed according to an example, depicted in successive stages of fabrication. Referring to FIG. 1A, the integrated circuit 1000 includes active areas 1002 which are not part of memory cells, an inverter p-type active area 1004 and an inverter n-type active area 1006 which are part of a complementary metal oxide semiconductor (CMOS) inverter, and possibly a dual input logic gate p-type active area 1008 and a dual input logic gate n-type active area 1010 which are part of a CMOS dual input logic gate. The integrated circuit 1000 also includes MOS gates 1012 which are not part of memory cells, an inverter MOS gate 1014 which is part of the CMOS inverter crossing the inverter p-type active area 1004 and the inverter n-type active area 1006, and, if the CMOS dual input logic gate is present, two dual input logic gate MOS gates 1016 crossing the dual input logic gate p-type active area 1008 and the dual input logic gate n-type active area 1010. A PMD (pre-metal dielectric) layer, not shown, is formed over an existing top layer of the integrated circuit 1000, covering the active areas 1002, 1004, 1008, and 1010, and the MOS gates 1012, 1014 and 1016. A contact hard mask layer, not shown, may be formed over the PMD layer. The contact hard mask layer may include one or more sublayers of materials resistant to etchants of the PMD main layer, such as silicon nitride, silicon carbide, aluminum oxide, and amorphous carbon under silicon oxy-nitride.

Areas for contacts are defined in the integrated circuit 1000. Referring to FIG. 1A, the desired contact areas may include compact single node contact areas 1018, which have length:width ratios between 0.8 and 1.0. Length:width ratios refer to lateral dimensions of the contact areas. The contact areas may also include elongated single node contact patterns 1020 which have length:width ratios above 2. The contact areas further include elongated contact areas 1022 which define areas for elongated contacts which directly connect to more than one active area and/or MOS gate. Some instances of elongated contact patterns 1022 may be linear. Some instances of elongated contact patterns 1022 may be nonlinear, for example having one or more bends, as depicted in FIG. 1A.

Figure 1B:
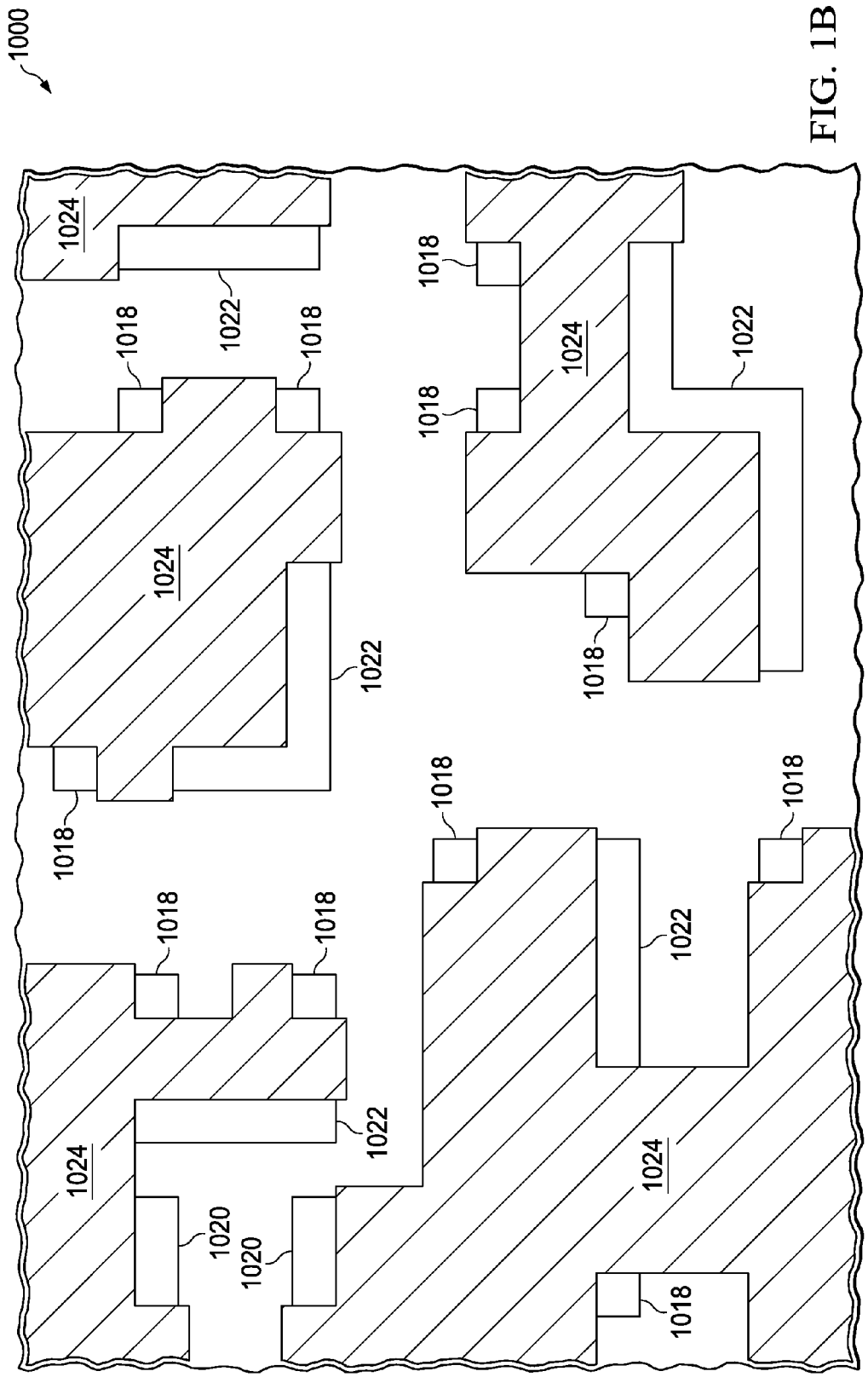

Referring to FIG. 1B, a first contact etch submask 1024 is formed over the integrated circuit 1000. The active areas and MOS gates depicted in FIG. 1A are not shown in FIG. 1B for clarity. The first contact etch submask 1024 is depicted in FIG. 1B with a hatch pattern, and the contact areas 1018, 1020 and 1022 are depicted unhatched. Edges of the first contact etch submask 1024 form portions of boundaries of the contact areas 1018, 1020 and 1022. The first contact etch submask 1024 may be formed, for example, by forming a bottom anti-reflection coating (BARC) on the integrated circuit 1000, followed by forming a first contact photoresist layer on the BARC, and subsequently forming a friction reducing top layer on the first contact photoresist layer which reduces drag in an immersion exposure operation. The first contact photoresist layer is exposed with a first contact subpattern in a first contact exposure operation, for example by an immersion scanner lithography tool, and developed. The developed first contact photoresist layer is treated in a process referred to as "freezing" forming the first contact etch submask 1024 so that it remains intact during a subsequent process sequence to produce a second contact etch submask. The freezing process may be performed, for example as described by Masafumi Hori, et. Al., "Sub-40 nm Half-Pitch Double Patterning with Resist Freezing Process," Advances in Resist Materials and Processing Technology XXV, Proc. Of SPIE Vol. 6923, 69230H, 2008. Other processes for treating the developed first contact photoresist layer so that it remains intact during formation of the second contact etch submask are within the scope of the instant example.

Figure 1C:
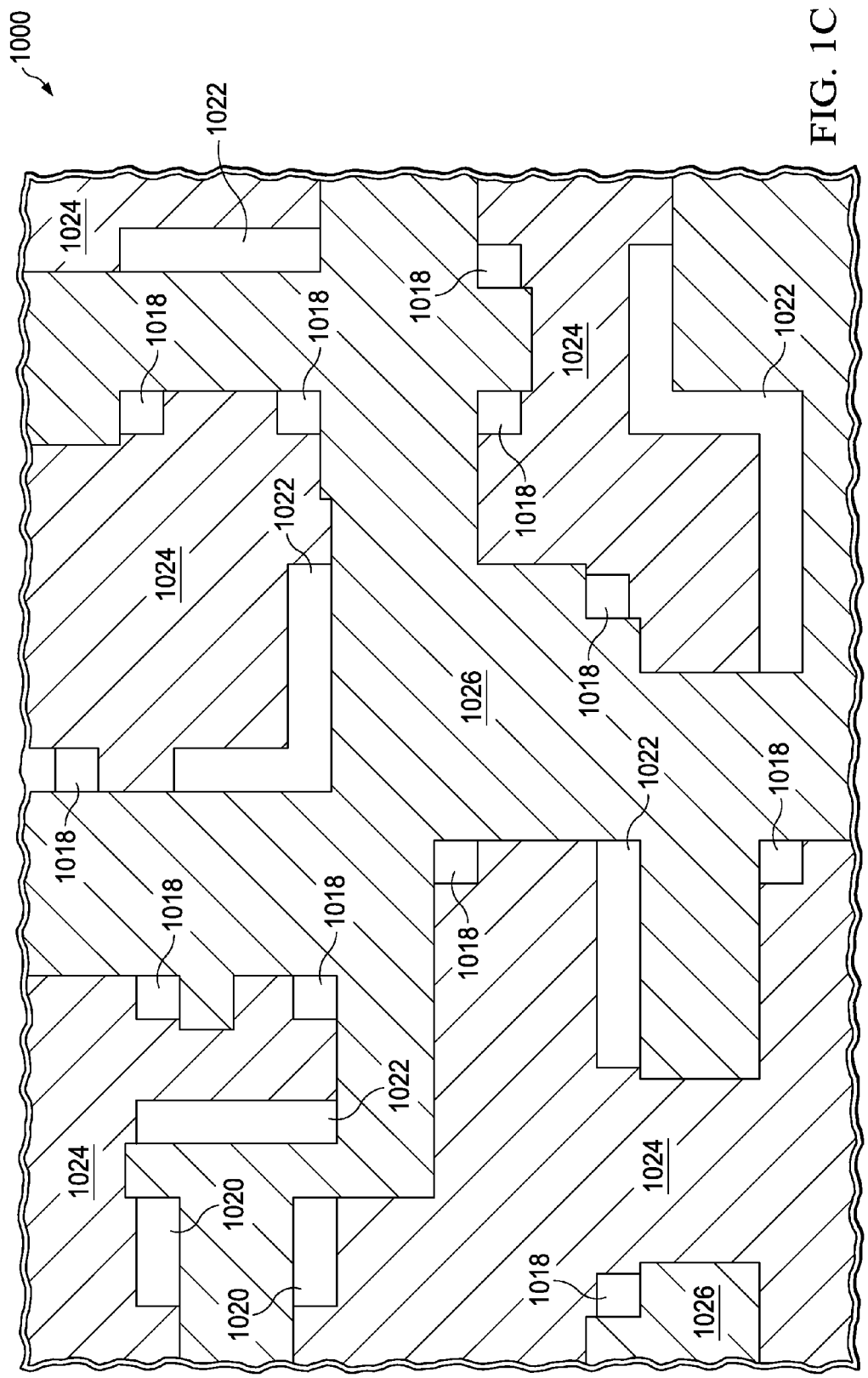

Referring to FIG. 1C, a second contact etch submask 1026 is formed over the integrated circuit 1000 so that the first contact etch submask 1024 in combination with the second contact etch submask 1026 form a contact etch mask which exposes the top surface of the integrated circuit 1000 in the contact areas 1018, 1020 and 1022. Boundaries of the contact areas 1018, 1020 and 1022 are formed by combined edges of the first contact etch submask 1024 and the second contact etch submask 1026. The second contact etch submask 1026 may be formed, for example, by forming a layer stack including a BARC, a second contact photoresist layer and a friction reducing top layer, followed by exposing the second contact photoresist layer with a second contact subpattern in a second contact exposure operation and developing the second contact photoresist layer. In one version of the instant example, no additional expose and develop sequences are performed in producing the contact etch mask. In one version of the instant example, some members of the contact areas 1018, 1020 and 1022 may be separated by less than a spatial resolution limit of the photolithography equipment used to perform the first contact exposure operation and/or the second contact exposure operation.

Contact holes are formed in the PMD layer using the combined contact etch mask (1024+1026). In versions of the instant example using a contact hard mask layer, contact hard mask material is removed from the contact hard mask layer by a first contact etch process, for example a reactive ion etch (RIE) process. The contact holes in the PMD layer are then formed by a second contact etch process using the etched hard mask layer as a template. The combined contact etch mask (1024+1026) may be removed after the first contact etch process, during the second contact etch process, or after the second contact etch process. In versions of the instant example without a contact hard mask layer, the contact holes in the PMD layer are formed by removing PMD material using a contact etch process, for example an RIE process, using the contact etch mask as a template. The contact etch mask may be removed during or after the contact etch process.

Figure 1D:
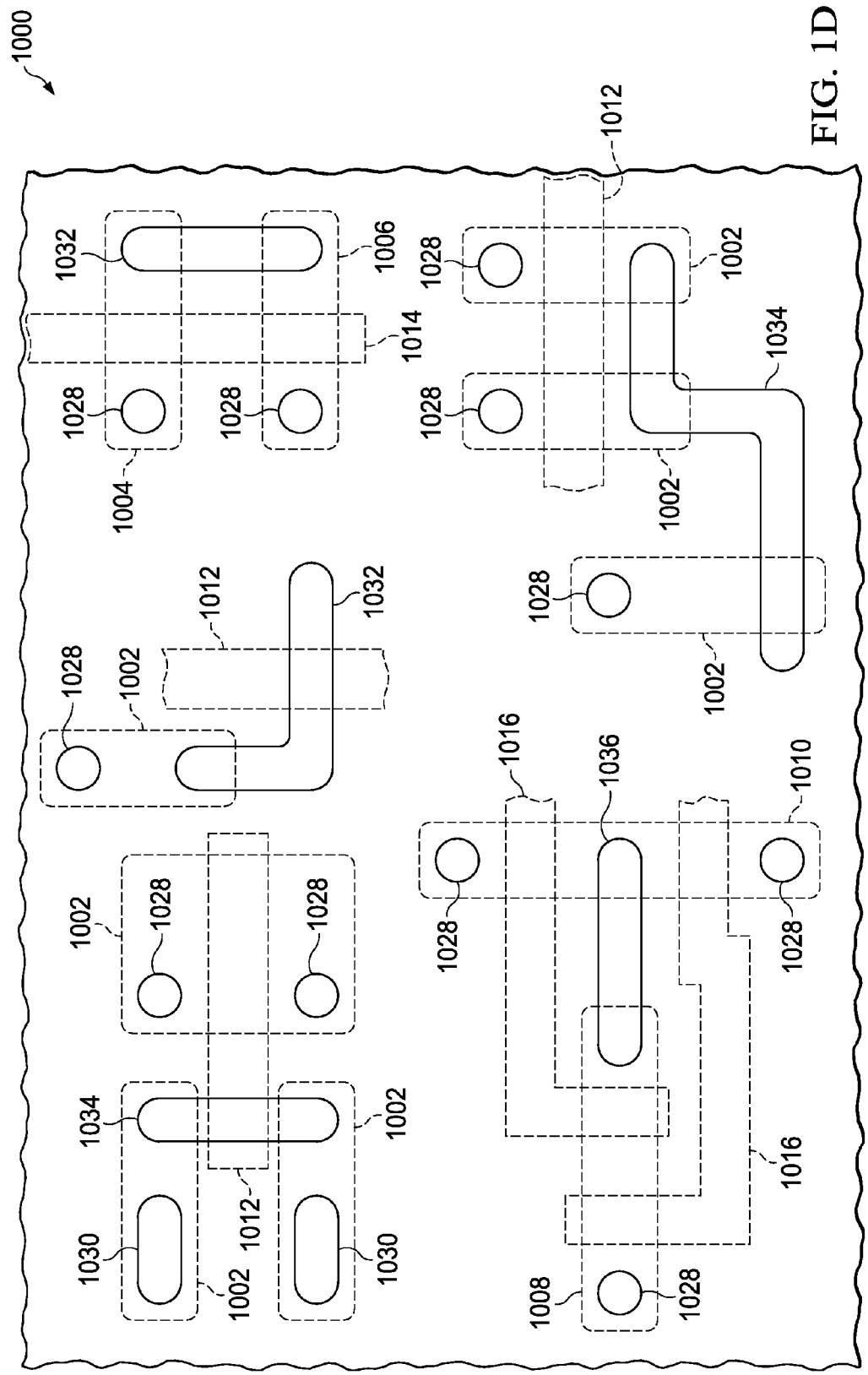

Referring to FIG. 1D, the contact holes in the PMD layer are filled with contact metal to form a plurality of contacts, including compact single node contacts 1028 which have length:width ratios between 0.8 and 1.0, elongated single node contacts 1030 which have length:width ratios above 2, dual node elongated contacts 1032 which connect to exactly two active areas 1002 and/or MOS gates 1012 and which are subsequently directly connected to a first level interconnect, and multiple node elongated contacts 1034 which connect to three or more active areas 1002 and/or MOS gates 1012. Some of the dual node elongated contacts 1032 are inverter output node elongated contacts in CMOS inverters which connect an output node of the inverter p-type active area 1004 with an output node of the inverter n-type active area 1006. If the CMOS dual input logic gate is formed, one of the dual node elongated contacts is a CMOS dual input logic gate contact 1036 which connects an output node of the CMOS dual input logic gate p-type active area 1008 with an output node of the CMOS dual input logic gate n-type active area 1010. The contacts 1028, 1030, 1032, 1034 and 1036 may be formed, for example, by filling the contact holes with a contact liner metal, such as titanium or titanium nitride, followed by a contact fill metal, such as tungsten, and subsequently removing the contact fill metal and contact liner metal from the top surface of the PMD layer using etching and/or CMP methods.

Figure 1E:
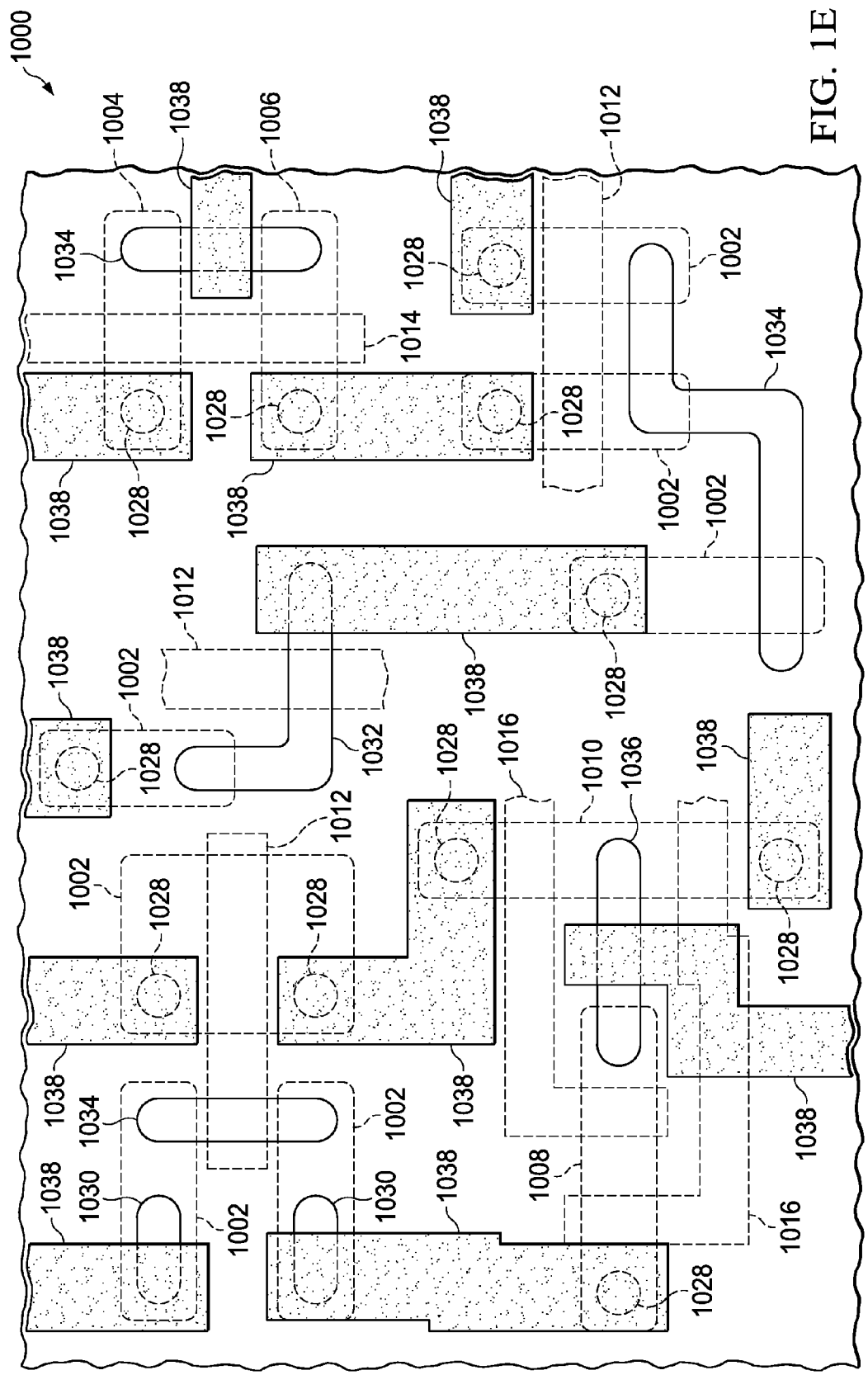

Referring to FIG. 1E, an IMD layer, not shown, is formed on the contacts and the PMD layer. The IMD layer may include silicon dioxide and/or a low-k dielectric material such as organo-silicate glass (OSG), carbon-doped silicon oxides (SiCO or CDO) or methylsilsesquioxane (MSQ). An interconnect hard mask layer, not shown, may be formed over the IMD layer. The interconnect hard mask layer may include one or more sublayers of materials resistant to etchants of the IMD layer, such as silicon nitride, silicon carbide, aluminum oxide, and titanium nitride. Areas 1038 for desired first level interconnects are defined in the integrated circuit 1000.

Figure 1F:
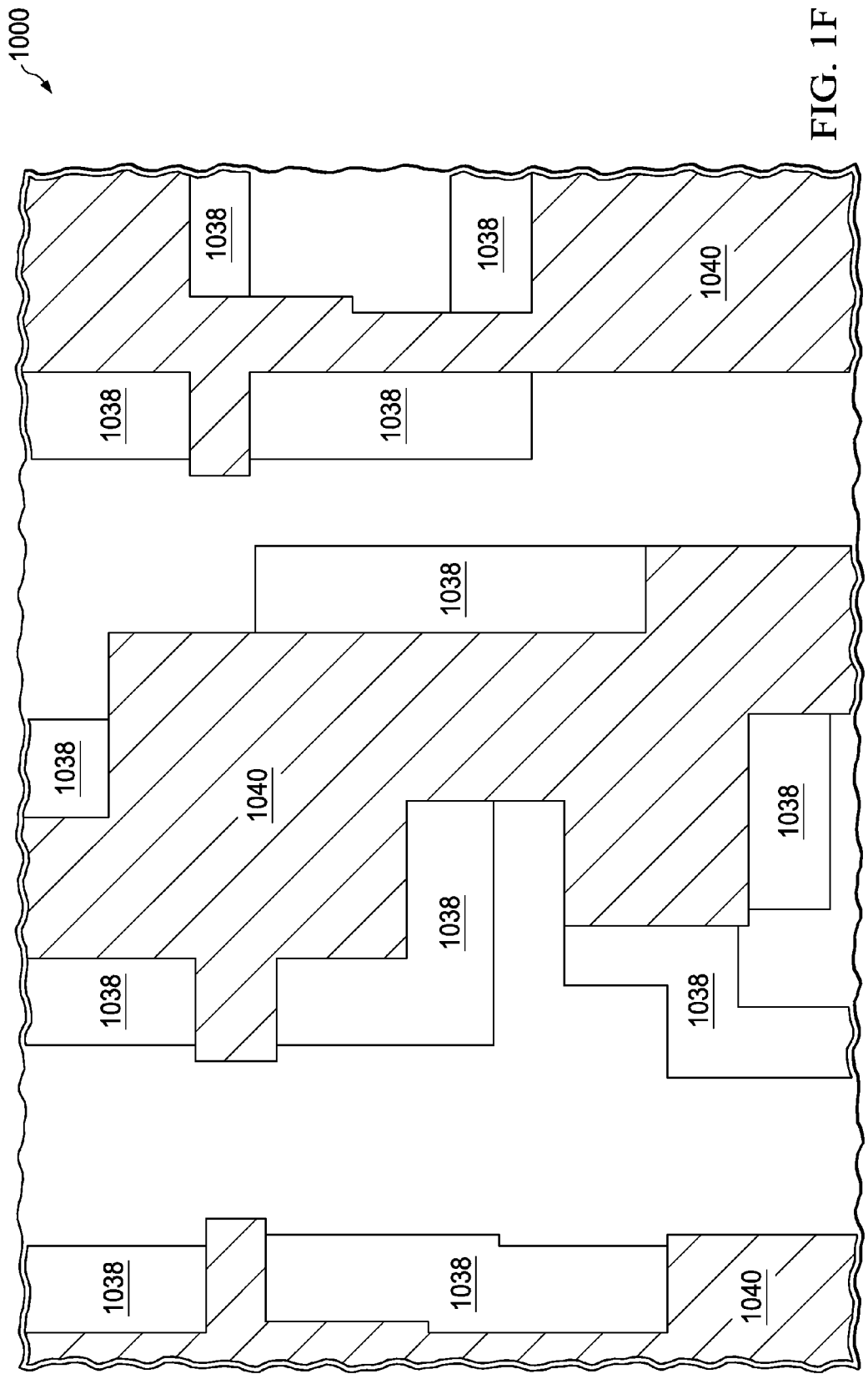

Referring to FIG. 1F, a first trench etch submask 1040 is formed on a top surface of the integrated circuit 1000. The active areas and MOS gates depicted in FIG. 1A are not shown in FIG. 1F for clarity. Edges of the first trench etch submask 1040 form portions of boundaries of the desired interconnect areas 1038. The first trench etch submask 1040 may be formed, for example, by forming a BARC on the integrated circuit 1000, followed by forming a first trench photoresist layer on the BARC, and subsequently forming a friction reducing top layer on the first trench photoresist layer. The first trench photoresist layer is exposed with a first trench subpattern in a first trench exposure operation, for example by an immersion scanner lithography tool, and developed. The developed first trench photoresist layer is treated in a freeze process forming the first trench etch submask 1040 so that it remains intact during a subsequent process sequence to produce a second trench etch submask. Other processes for treating the developed first trench photoresist layer so that it remains intact during formation of the second trench etch submask are within the scope of the instant example.

Figure 1G:
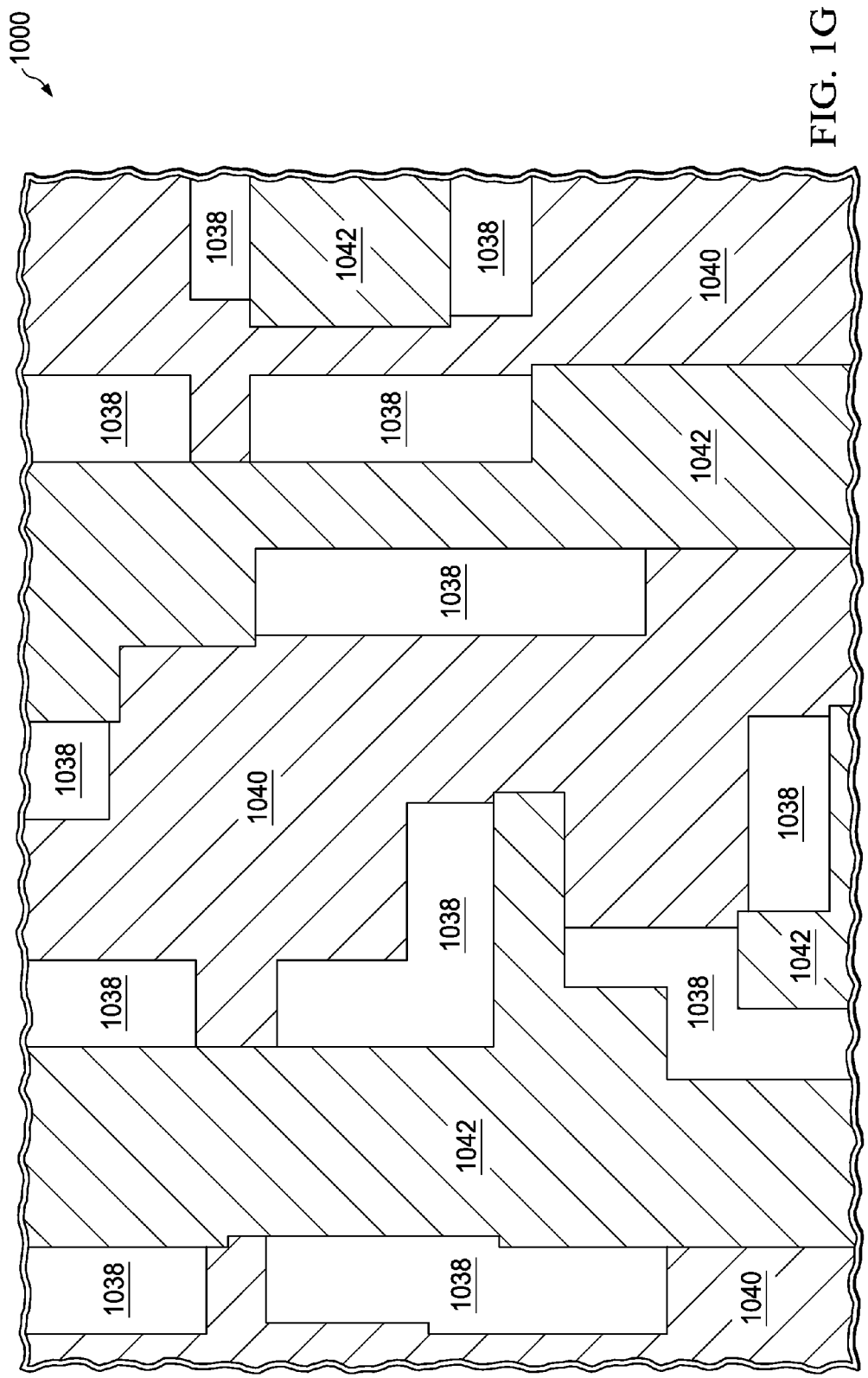

Referring to FIG. 1G, a second trench etch submask 1042 is formed over the integrated circuit 1000 so that the first trench etch submask 1040 in combination with the second trench etch submask 1042 form a trench etch mask which exposes the top surface of the integrated circuit 1000 in the interconnect areas 1038. Boundaries of the interconnect areas 1038 are formed by combined edges of the first trench etch submask 1040 and the second trench etch submask 1042. The second trench etch submask 1042 may be formed, for example, by forming a layer stack including a BARC, a second trench photoresist layer and a friction reducing top layer, followed by exposing the second trench photoresist layer with a second trench subpattern in a second trench exposure operation and developing the second trench photoresist layer. In one version of the instant example, no additional expose and develop sequences are performed in producing the trench etch mask. In one version of the instant example, some members of the interconnect areas 1038 may be separated by less than a spatial resolution limit of the photolithography equipment used to perform the first trench exposure operation and/or the second trench exposure operation.

Interconnect trenches are formed in the IMD layer using the trench etch mask. In versions of the instant example using an interconnect hard mask layer, interconnect hard mask material is removed from the interconnect hard mask layer by a first trench etch process, for example an RIE process. The trenches in the IMD layer are then formed by a second trench process using the etched interconnect hard mask layer as a template. The trench etch mask may be removed after the first trench etch process, during the second trench etch process, or after the second trench etch process. In versions of the instant example without an interconnect hard mask layer, the trenches in the IMD layer are formed by removing IMD material using a trench etch process, for example an RIE process, using the trench etch mask as a template. The trench etch mask may be removed during or after the trench etch process.

Figure 1H:
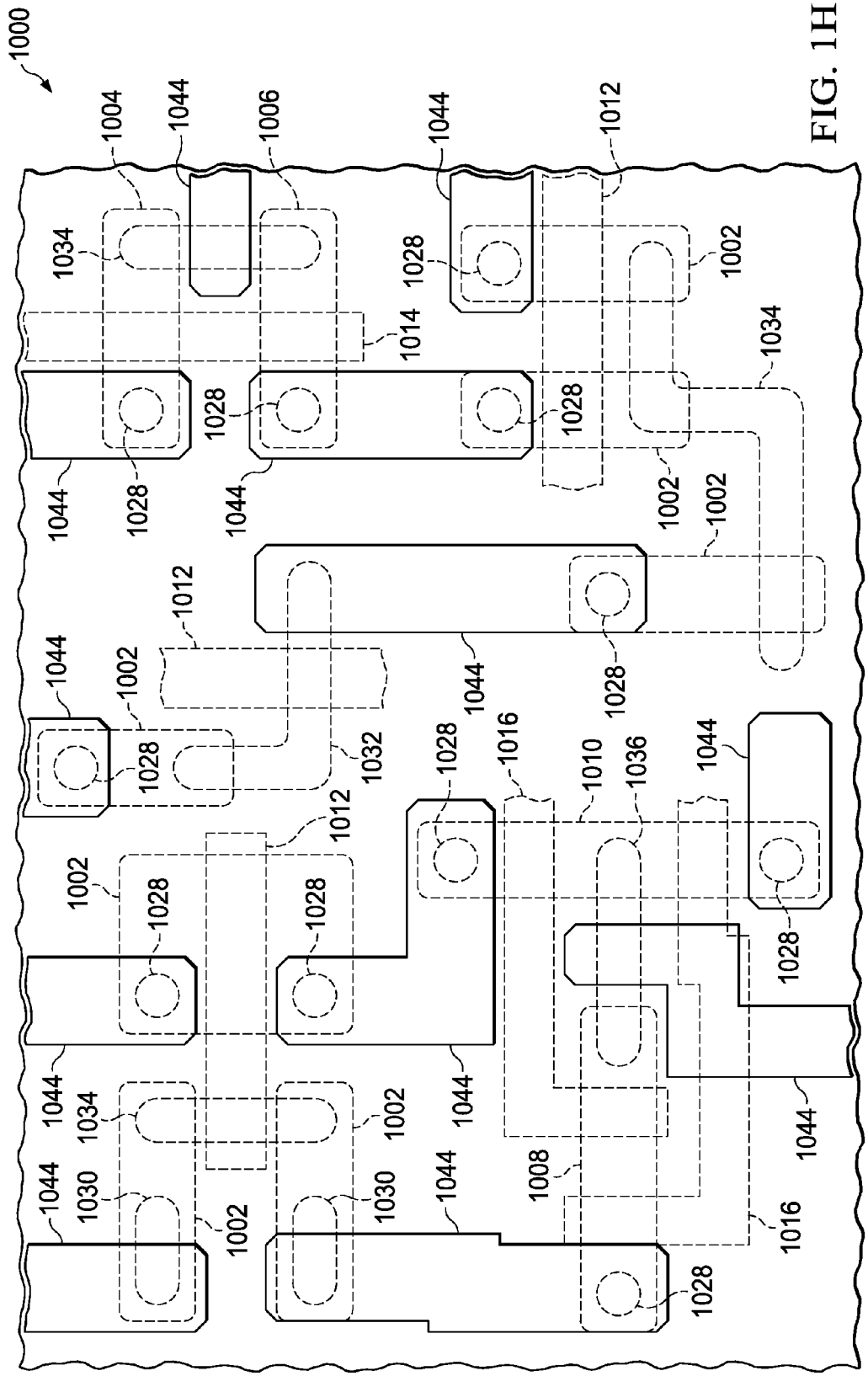

Referring to FIG. 1H, a plurality of first level interconnects 1044 are formed in the interconnect trenches, for example by filling the interconnect trenches with an interconnect metal, such as a liner metal including tantalum nitride and a fill metal including at least 90 percent copper, and removing unwanted liner metal and fill metal using a CMP operation. Bottom surfaces of at least a portion of the first level interconnects 1044 directly connect to a portion of or possibly all of the contacts. Dual node elongated contacts 1032 are directly connected to first level interconnects 1044. Additional levels of dielectric layers and interconnects, not shown, for example vertical interconnects, also known as vias, are formed above the first level interconnects 1044. A plurality of interconnects in the additional levels directly connects to some or all members of the plurality of first level interconnects 1044.

Figure 2A:
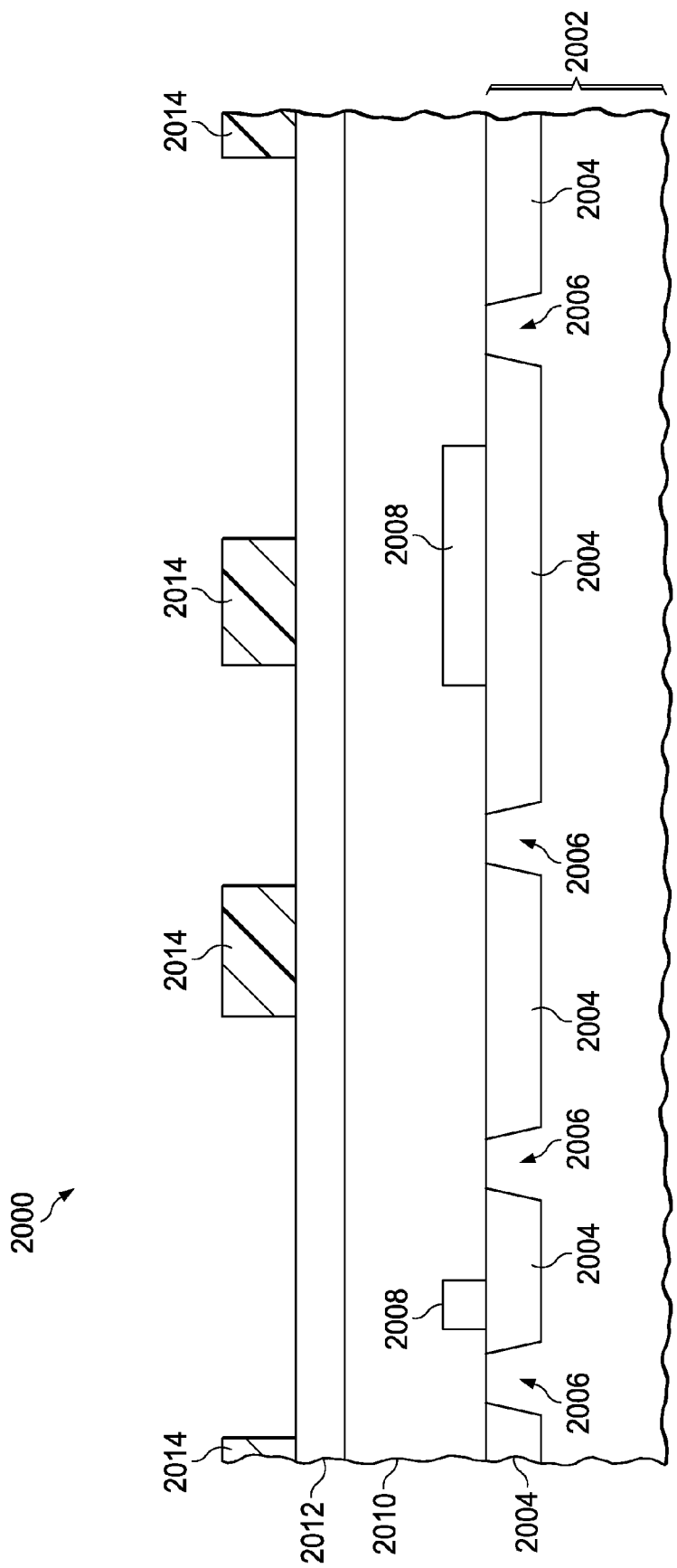
FIG. 2A through FIG. 2K are cross-sections of an integrated circuit formed according to an example, depicted in successive stages of fabrication.

FIG. 2A through FIG. 2K are cross-sections of an integrated circuit formed according to an example with contact and trench hardmasks, depicted in successive stages of fabrication. Referring to FIG. 2A, the integrated circuit 2000 is formed in and on a substrate 2002 which may be a single crystal silicon wafer, a silicon-on-insulator (SOI) wafer, a hybrid orientation technology (HOT) wafer with regions of different crystal orientations, or other material appropriate for fabrication of the integrated circuit 2000. Elements of field oxide 2004 are formed at a top surface of the substrate 2002 typically of silicon dioxide between 250 and 600 nanometers thick, commonly by shallow trench isolation (STI) or local oxidation of silicon (LOCOS) processes. In STI processes, silicon dioxide may be deposited by high density plasma (HDP) or high aspect ratio process (HARP). Regions at the top surface of the substrate 2002 between the field oxide 2004 are active areas 2006 of the integrated circuit 2000. The active areas 2006 may include a layer of metal silicide at a top surface of the substrate 2002. MOS gates 2008 are formed over the substrate 2002. A PMD layer 2010 is formed over the active areas 2006 and the MOS gates 2008. The PMD layer 2010 may be a dielectric layer stack including a PMD liner, a PMD main layer, and an optional PMD cap layer. The PMD liner, not shown, is commonly silicon nitride or silicon dioxide, 10 to 100 nanometers thick, deposited by plasma enhanced chemical vapor deposition (PECVD) over the active areas 2006 and the MOS gates 2008. The PMD main layer is commonly a layer of silicon dioxide, phospho-silicate glass (PSG) or boro-phospho-silicate glass (BPSG), commonly 100 to 1000 nanometers thick, deposited by PECVD on a top surface of the PMD liner, and sometimes leveled by a chemical-mechanical polish (CMP) process. The optional PMD cap layer, not shown, is commonly 10 to 100 nanometers of a hard material such as silicon nitride, silicon carbide nitride or silicon carbide, formed on a top surface of the PMD main layer. A contact hard mask layer 2012 is formed over the PMD layer 2010. The contact hard mask layer 2012 may have the materials and properties described in reference to FIG. 1A.

A first contact etch submask 2014 is formed on the contact hard mask layer 2012 as follows. A first contact photosensitive layer is formed over the contact hard mask layer 2012. The first contact photosensitive layer may include a layer of BARC, a photoresist layer, and one or more optional layers to improve the lithography process. A first contact etch submask exposure operation using photolithographic equipment such as an immersion wafer scanner and a first contact etch submask develop operation are performed on the integrated circuit 2000 to produce a developed photoresist layer. A first freeze operation is performed on the developed photoresist layer to form the first contact etch submask 2014 so that it remains intact during a subsequent process sequence to produce a second contact etch submask. Edges of the first contact etch submask 2014 form portions of boundaries of areas defined for contacts in the integrated circuit 2000.

Figure 2B:
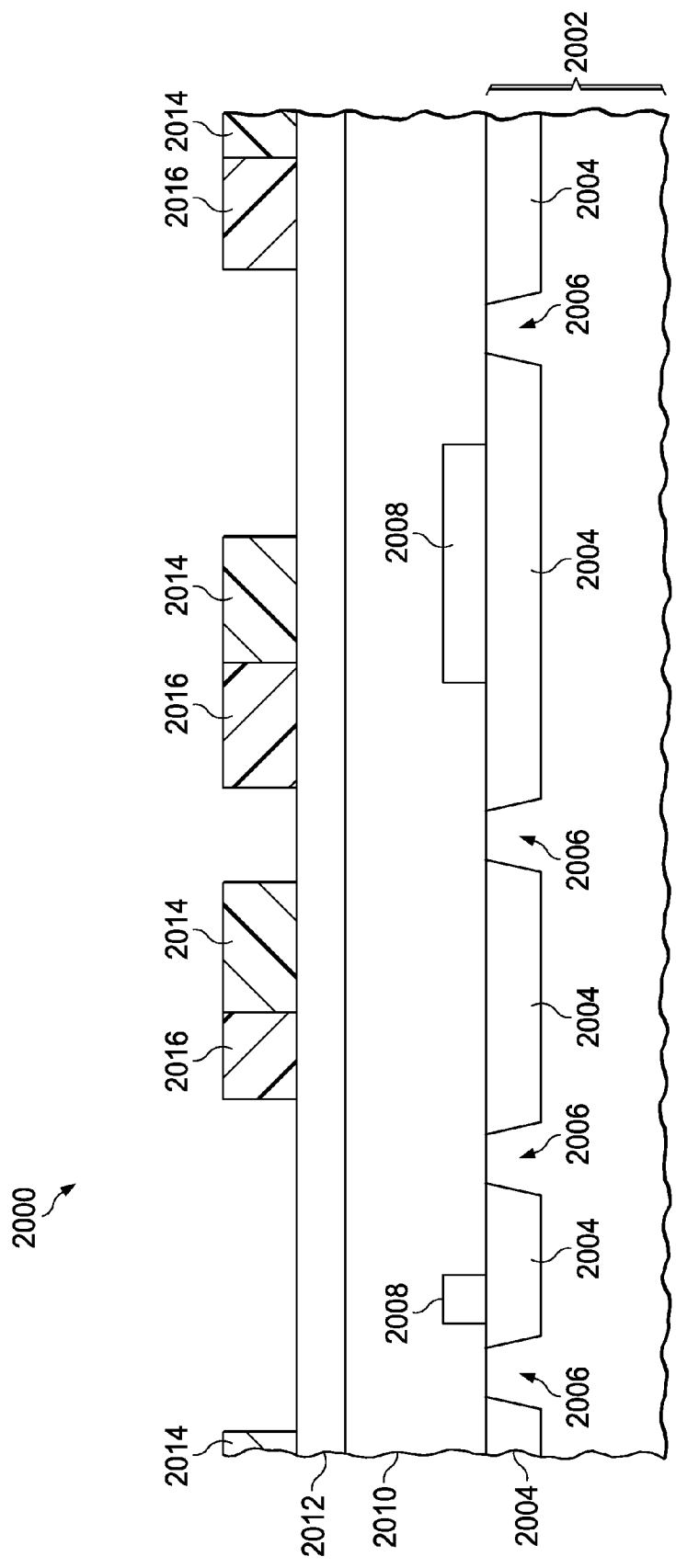

Referring to FIG. 2B, a second contact etch submask 2016 is formed on the contact hard mask layer 2012 so that the first contact etch submask 2014 in combination with the second contact etch submask 2016 form a contact etch mask which exposes a top surface of the contact hard mask layer 2012 in the contact areas. The second contact etch submask 2016 may be formed, for example, by forming a layer stack including a BARC, a photoresist layer and a friction reducing top layer, followed by exposing and developing the photoresist layer. In one version of the instant example, no additional expose and develop sequences are performed in producing the contact etch mask.

Figure 2C:
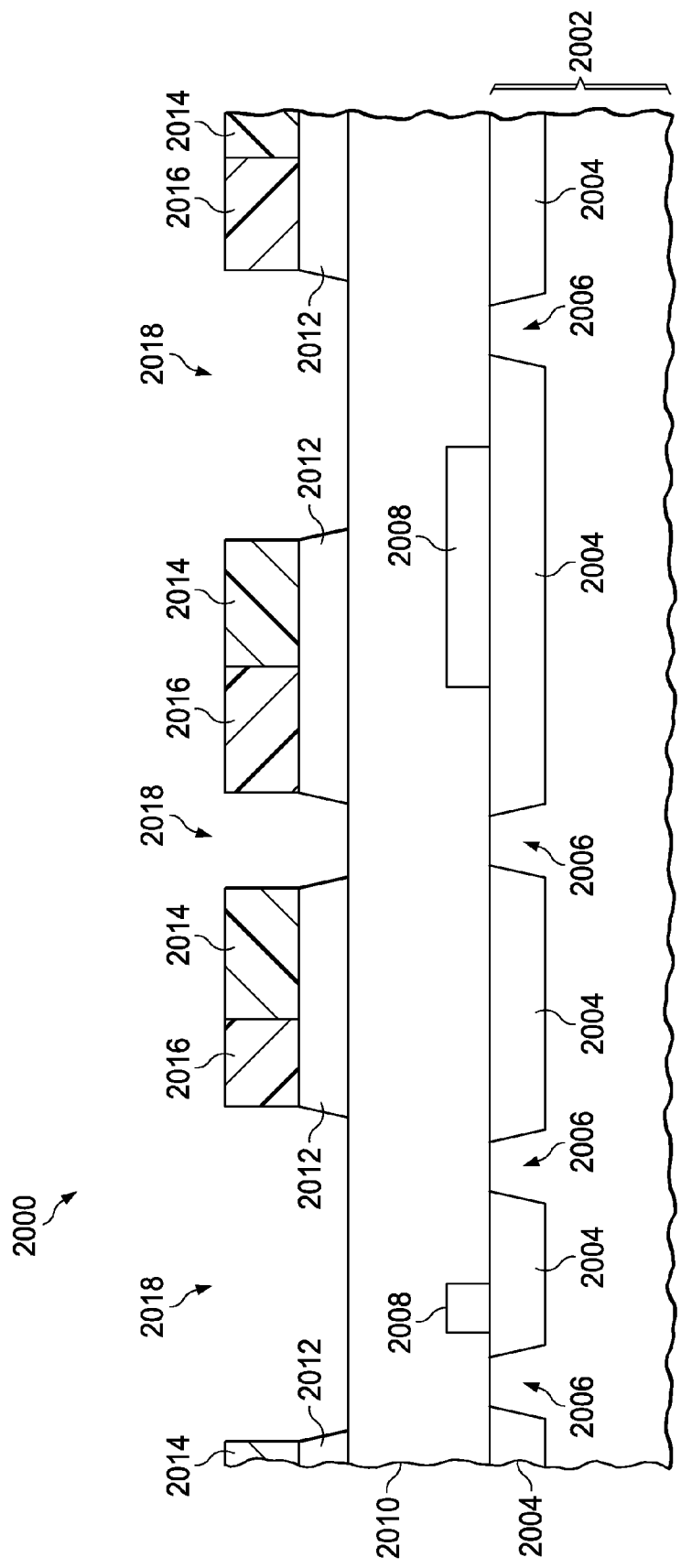

Referring to FIG. 2C, a contact hard mask etch process is performed on the integrated circuit 2000 which removes material from the contact hard mask layer 2012 in the contact areas to form contact hard mask holes 2018. The contact hard mask etch process may be, for example, an RIE process. The first contact etch submask 2014 and the second contact etch submask 2016 may be removed after the contact hard mask etch process is completed, or may be removed during subsequent operations.

Figure 2D:
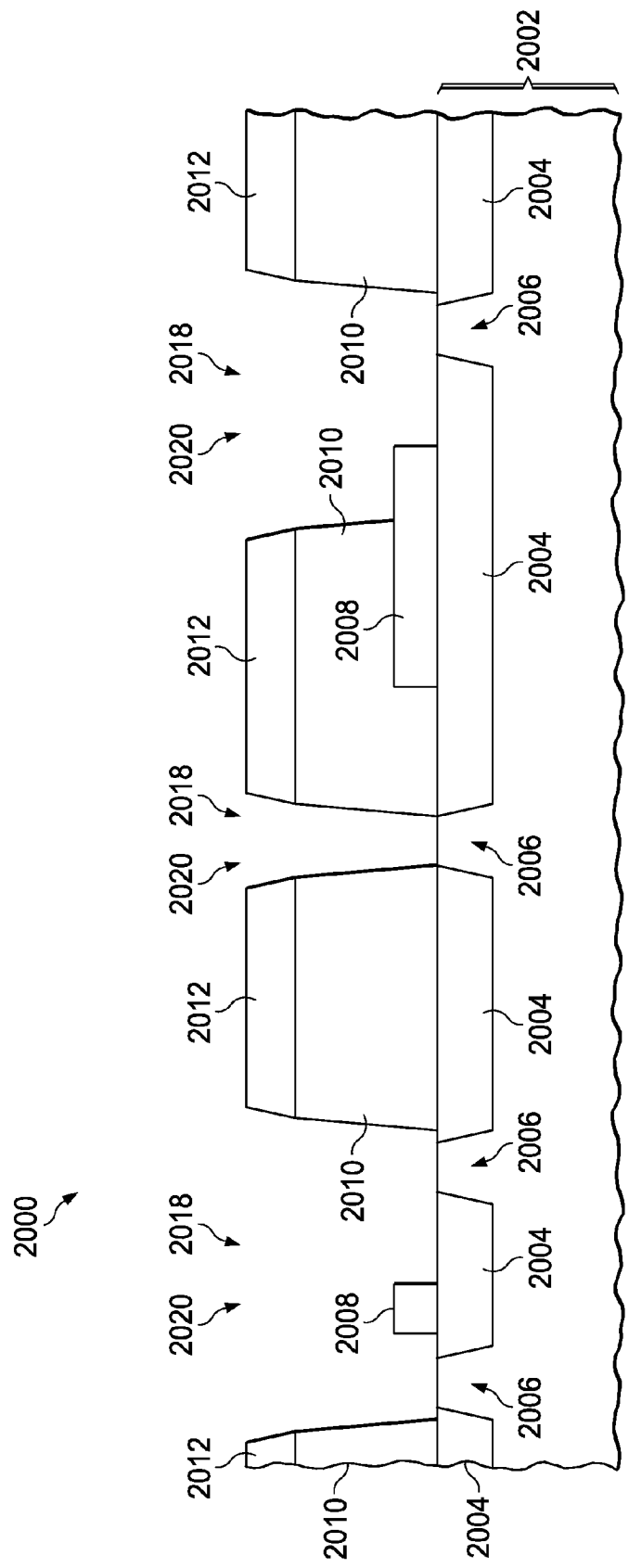

Referring to FIG. 2D, a contact etch process is performed on the integrated circuit 2000 which removes material from the PMD layer 2010 in the contact areas to form contact holes 2020. The contact etch process uses the etched contact hard mask layer 2012 as a template. Remaining material in the contact hard mask layer 2012 may be removed after the contact etch process is completed.

Figure 2E:
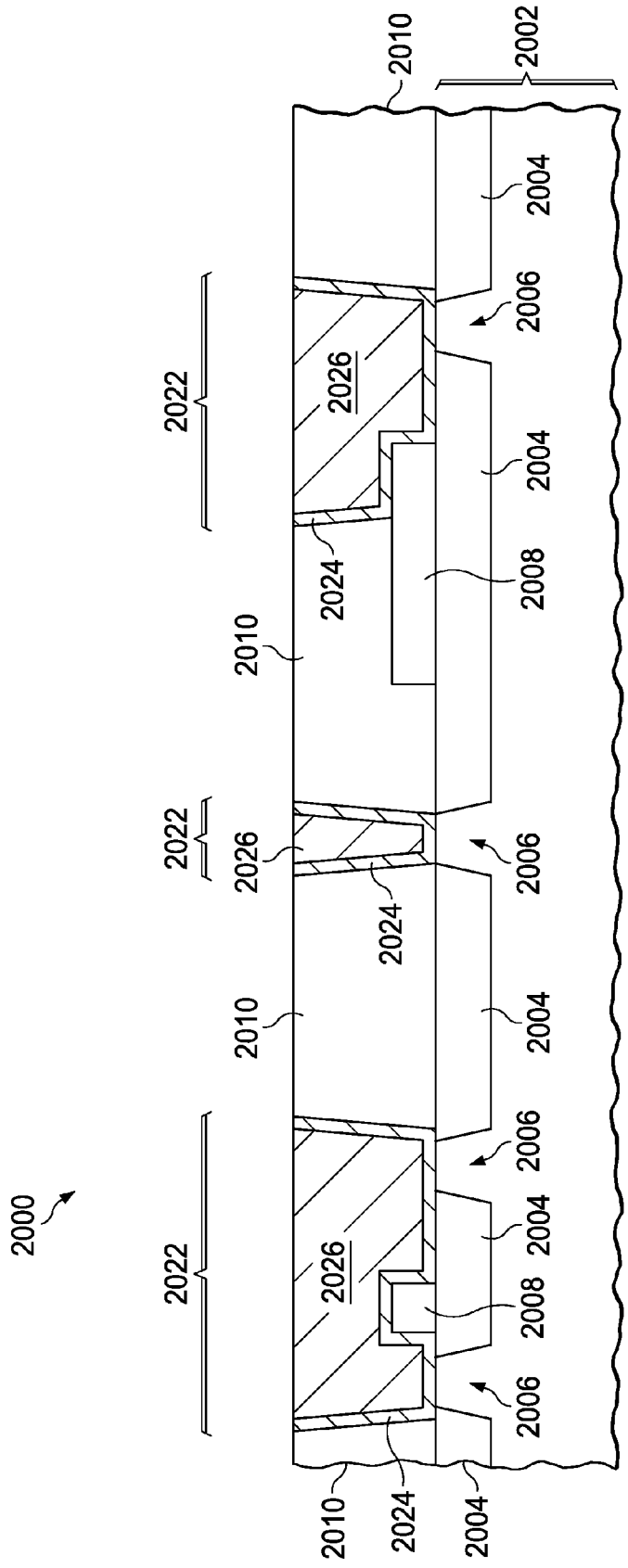

FIG. 2E depicts the integrated circuit 2000 after a contact metallization process is completed, forming contacts 2022. In one version of the instant example, a layer of contact liner metal 2024 followed by a contact fill metal 2026 are formed in the contact holes. The contact liner metal 2024 may be, for example, titanium, titanium nitride, or other metal suitable for forming contact the active areas 2006 and MOS gates 2008. The contact fill metal 2026 may be, for example, tungsten. The contact liner metal 2024 may be formed, for example, by sputtering, atomic layer deposition (ALD), metal organic chemical vapor deposition (MOCVD) or other process. The contact fill metal 2026 may be formed, for example, by sputtering, MOCVD, or other process. Contact liner metal and contact fill metal on the top surface of the PMD layer 2010 may be removed by CMP and/or etchback processes. The contacts 2022 include dual node elongated contacts which connect to exactly two active areas 2006 and/or MOS gates 2008 and which are subsequently directly connected to a first level interconnect, and multiple node elongated contacts which connect to three or more active areas 2006 and/or MOS gates 2008.

Figure 2F:
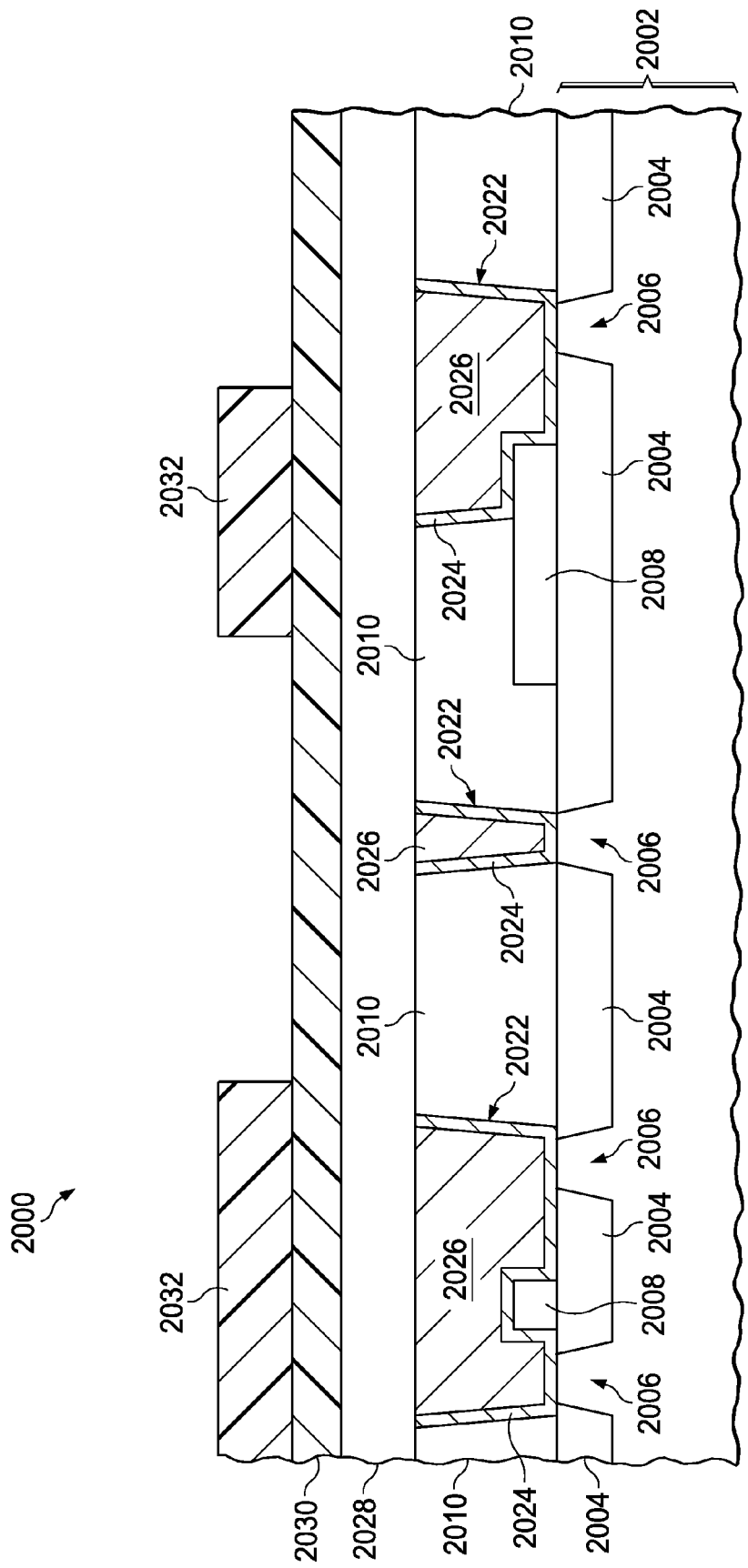

Referring to FIG. 2F, an IMD layer 2028 is formed on the PMD layer 2010 and on top surfaces of the contacts 2022. The IMD layer 2028 may have the materials and properties described in reference to FIG. 1E. An interconnect hard mask layer 2030 is formed on the IMD layer 2028. The interconnect hard mask layer 2030 may have the materials and properties described in reference to FIG. 1E. A first trench etch submask 2032 is formed on the interconnect hard mask layer 2030, using a process sequence similar to that described in reference to FIG. 2A. A second freeze operation is performed on a developed photoresist layer to form the first trench etch submask 2032 so that it remains intact during a subsequent process sequence to produce a second trench etch submask. Edges of the first trench etch submask 2032 form portions of boundaries of areas defined for interconnects in the integrated circuit 2000.

Figure 2G:
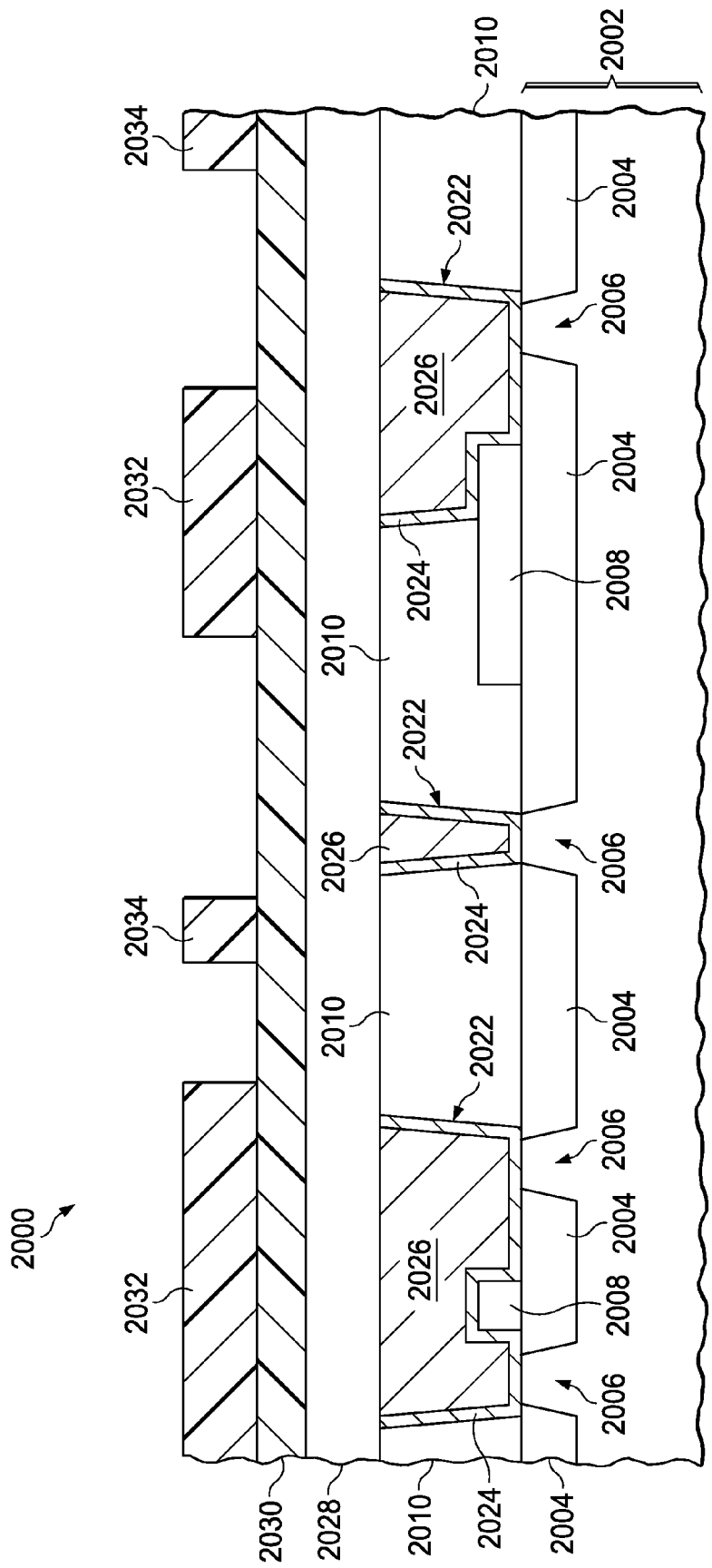

Referring to FIG. 2G, a second trench etch submask 2034 is formed on the interconnect hard mask layer 2030 so that the first trench etch submask 2032 in combination with the second trench etch submask 2034 form a trench etch mask which exposes a top surface of the interconnect hard mask layer 2030 in the interconnect areas. The second trench etch submask 2034 may be formed, for example, by forming a layer stack including a BARC, a photoresist layer and a friction reducing top layer, followed by exposing and developing the photoresist layer. In one version of the instant example, no additional expose and develop sequences are performed in producing the trench etch mask.

Figure 2H:
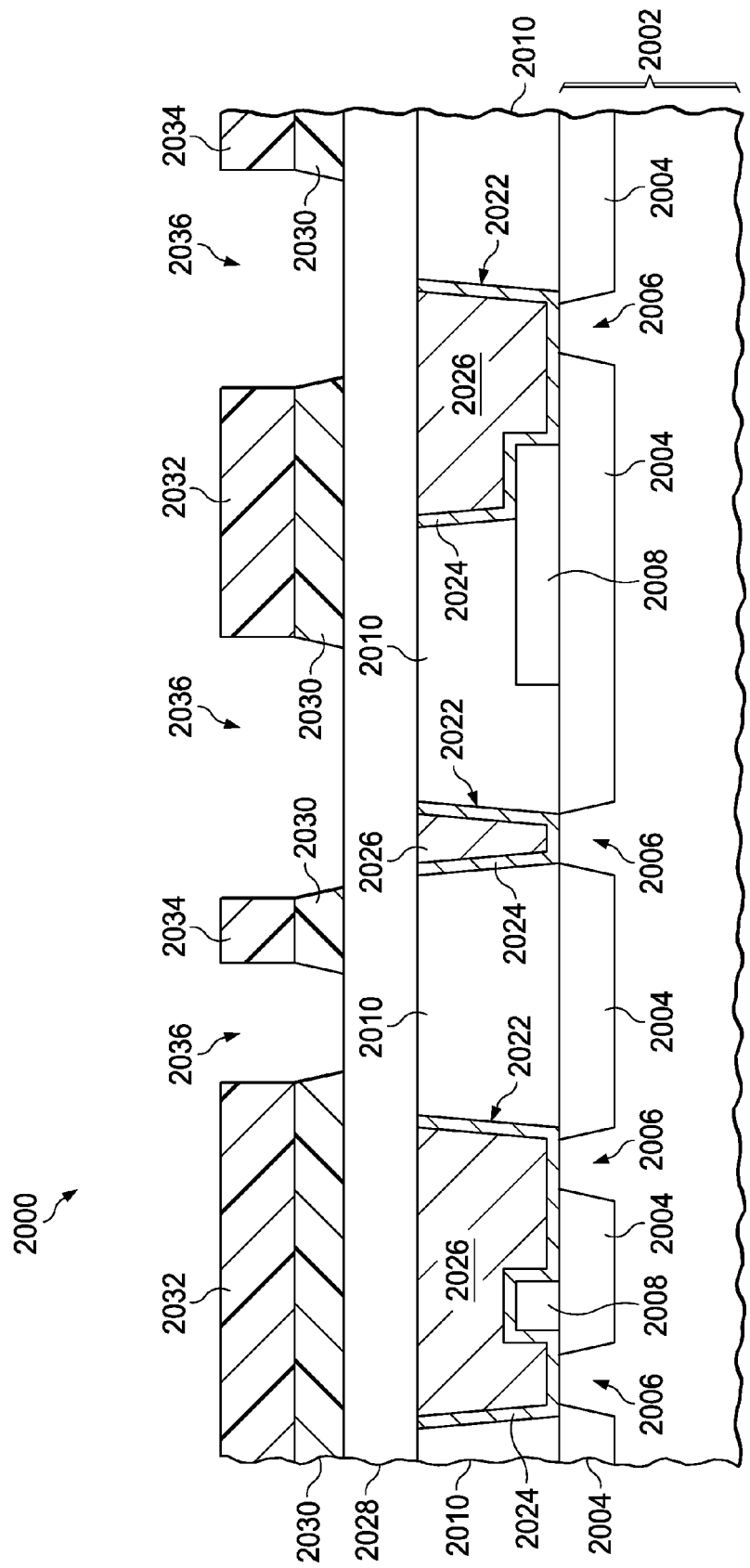

Referring to FIG. 2H, an interconnect hard mask etch process is performed on the integrated circuit 2000 which removes material from the interconnect hard mask layer 2030 in the interconnect areas to form interconnect hard mask holes 2036. The interconnect hard mask etch process may be, for example, an RIE process. The first trench etch submask 2032 and the second trench etch submask 2034 may be removed after the interconnect hard mask etch process is completed, or may be removed during subsequent operations.

Figure 2I:
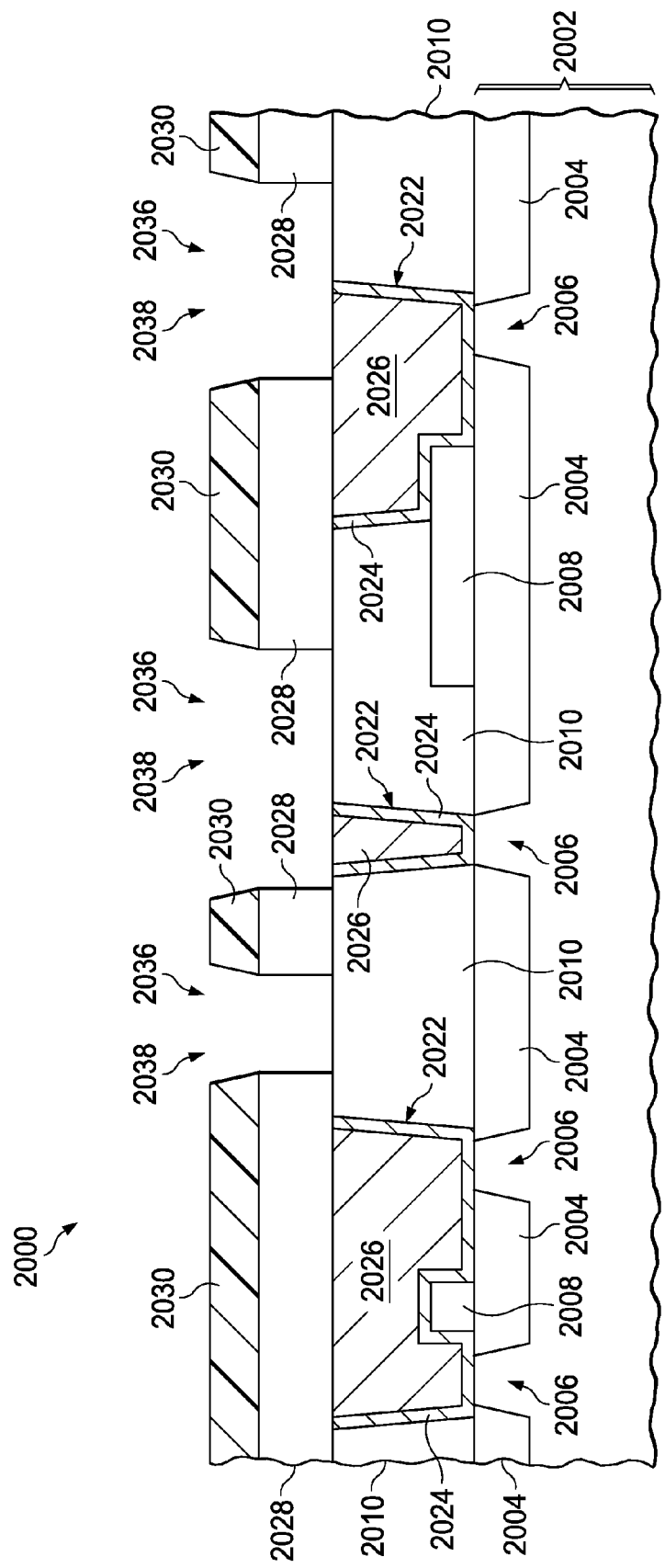

Referring to FIG. 2I, an interconnect trench etch process is performed on the integrated circuit 2000 which removes material from the IMD layer 2028 in the interconnect areas to form interconnect trenches 2038. The trench etch process uses the etched interconnect hard mask layer 2030 as a template. Remaining material in the interconnect hard mask layer 2030 may be removed after the interconnect trench etch process is completed.

Figure 2J:
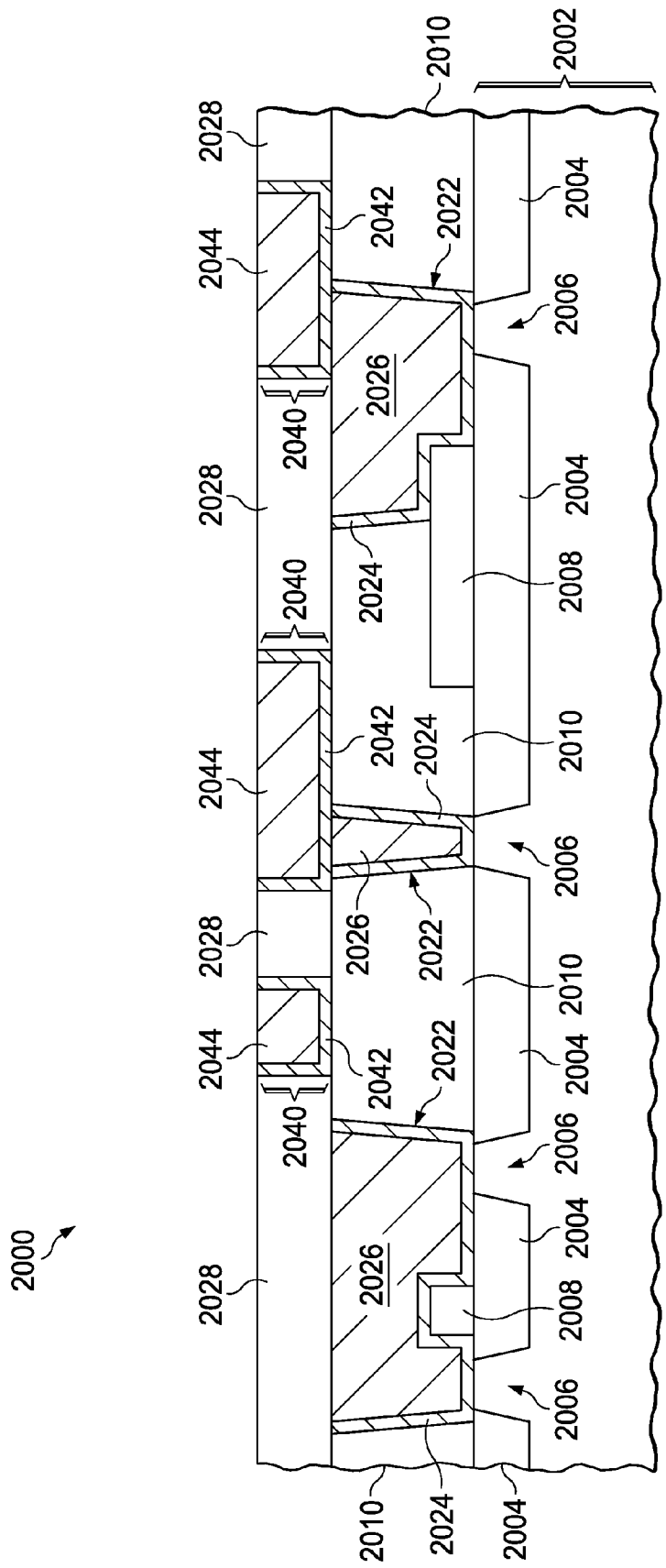

FIG. 2J depicts the integrated circuit 2000 after an interconnect metallization process is completed, forming interconnects 2040. In one version of the instant example, a layer of trench liner metal 2042 followed by a trench fill metal 2044 are formed in the trenches. The trench liner metal 2042 may be, for example, tantalum nitride, titanium nitride, or other metal suitable for forming electrical connections to the contacts 2022. The trench fill metal 2044 may be, for example, at least 90 percent copper. The trench liner metal 2042 may be formed, for example, by sputtering, ALD, MOCVD or other process. The trench fill metal 2044 may be formed, for example, by sputtering, plating, or other process. Trench liner metal and trench fill metal on the top surface of the IMD layer 2028 may be removed by CMP and/or etchback processes. Dual node elongated contacts which connect to exactly two active areas 2006 and/or MOS gates 2008 and are directly connected to a first level interconnect 2040.

Figure 2K:
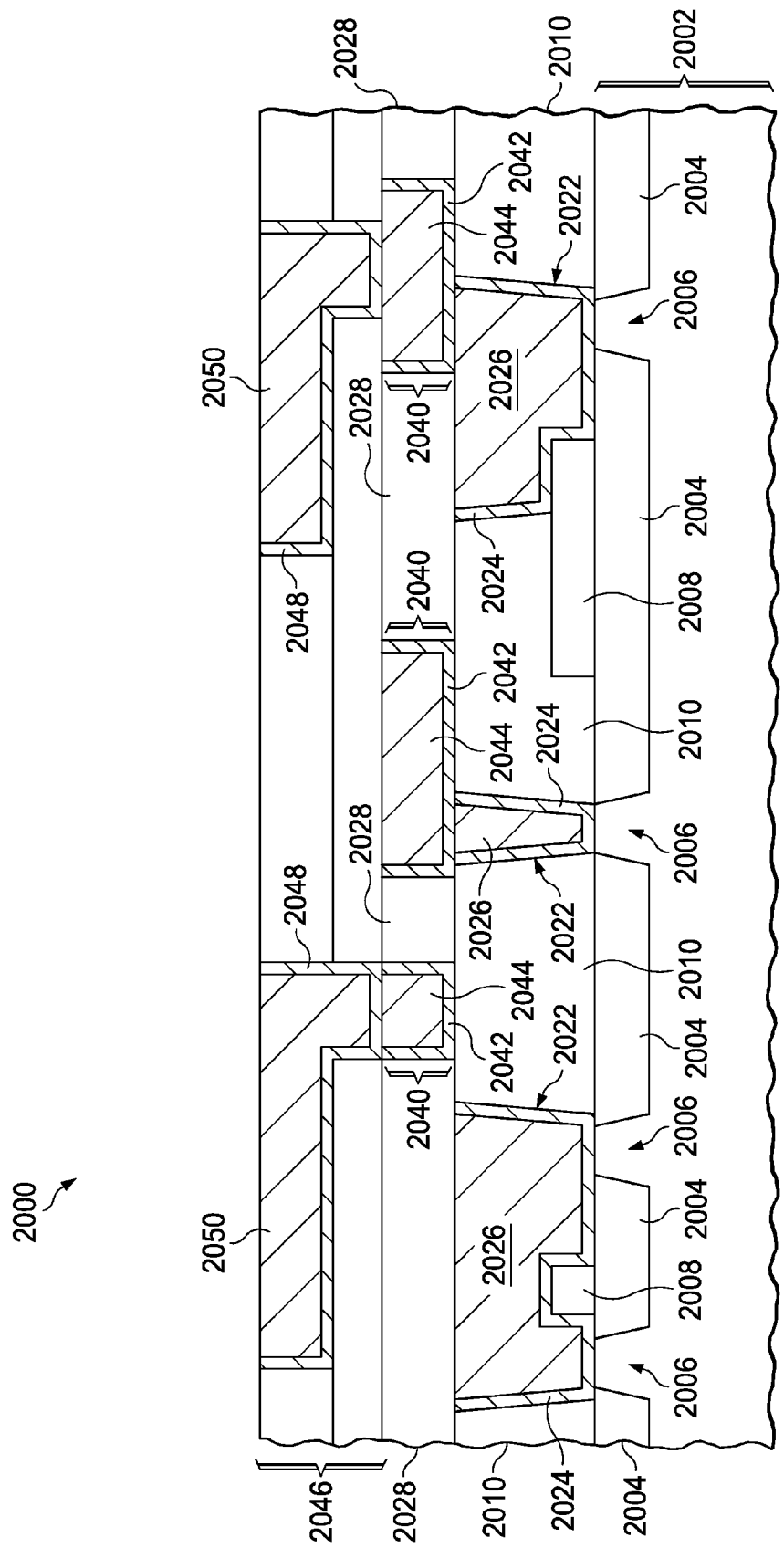

Referring to FIG. 2K, additional levels of dielectric layers and interconnects 2046 for example vias 2048 and second level interconnects 2050, are formed above the first level interconnects 2040. A plurality of vias 2048 in the additional levels 2046 directly connects to the first level interconnects 2040.

Figure 3A:
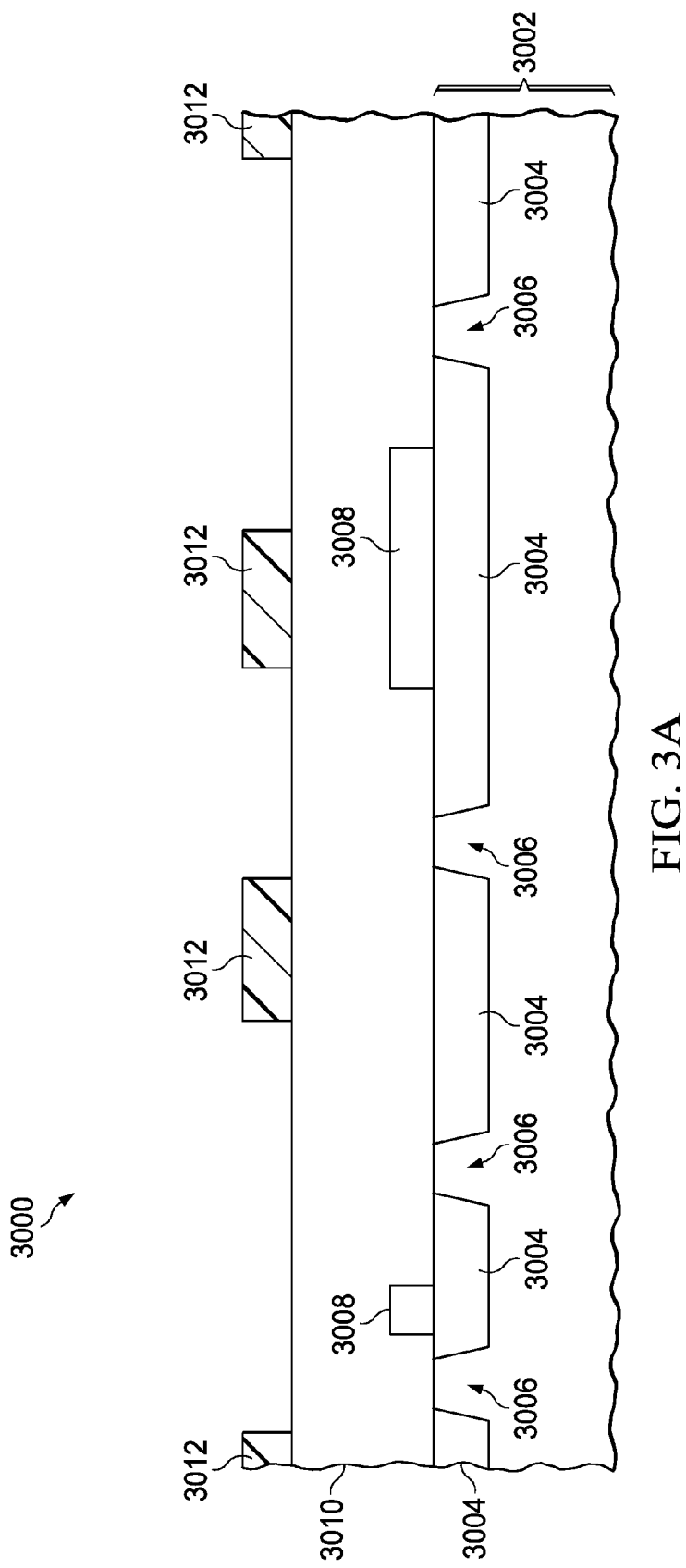
FIG. 3A through FIG. 3H are cross-sections of an integrated circuit formed according to an example, depicted in successive stages of fabrication.

FIG. 3A through FIG. 3H are cross-sections of an integrated circuit formed according to an example without hardmasks, depicted in successive stages of fabrication. Referring to FIG. 3A, the integrated circuit 3000 is formed in and on a substrate 3002 which may be a single crystal silicon wafer, a SOI wafer, a HOT wafer with regions of different crystal orientations, or other material appropriate for fabrication of the integrated circuit 3000. Elements of field oxide 3004 are formed at a top surface of the substrate 3002 typically of silicon dioxide between 250 and 600 nanometers thick, commonly by STI or LOCOS processes. In STI processes, silicon dioxide may be deposited by HDP or HARP. Regions at the top surface of the substrate 3002 between the field oxide 3004 are active areas 3006 of the integrated circuit 3000. The active areas 3006 may include a layer of metal silicide at a top surface of the substrate 3002. MOS gates 3008 are formed over the substrate 3002. A PMD layer 3010 is formed over the active areas 3006 and the MOS gates 3008. The PMD layer 3010 may have the materials and properties described in reference to FIG. 2A. A first contact etch submask 3012 is formed on the PMD layer 3010 as described in reference to FIG. 2A, using a first freeze operation so that the first contact etch submask 3012 remains intact during a subsequent process sequence to produce a second contact etch submask. Edges of the first contact etch submask 3012 form portions of boundaries of areas defined for contacts in the integrated circuit 3000.

Figure 3B:
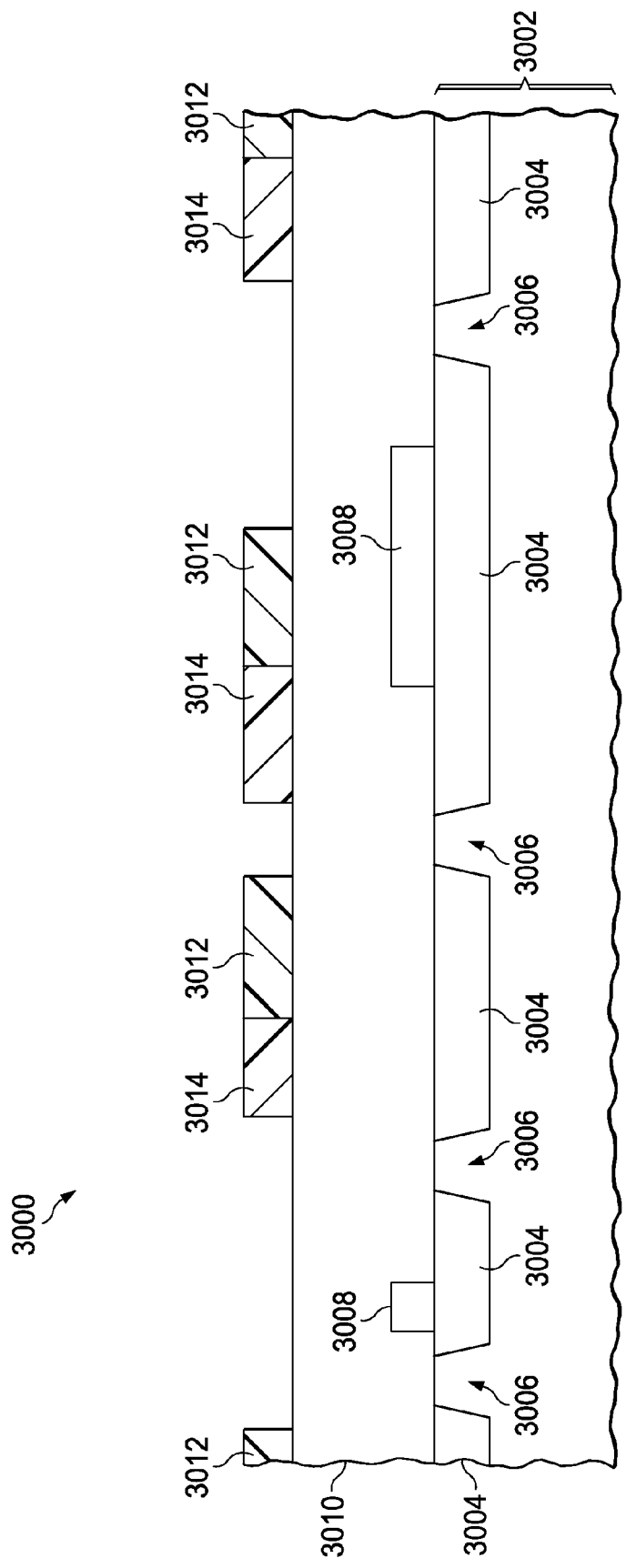

Referring to FIG. 3B, a second contact etch submask 3014 is formed on the PMD layer 3010 so that the first contact etch submask 3012 in combination with the second contact etch submask 3014 form a contact etch mask which exposes a top surface of the PMD layer 3010 in the contact areas. The second contact etch submask 3014 may be formed, for example, by forming a layer stack including a BARC, a photoresist layer and a friction reducing top layer, followed by exposing and developing the photoresist layer. In one version of the instant example, no additional expose and develop sequences are performed in producing the contact etch mask.

Figure 3C:
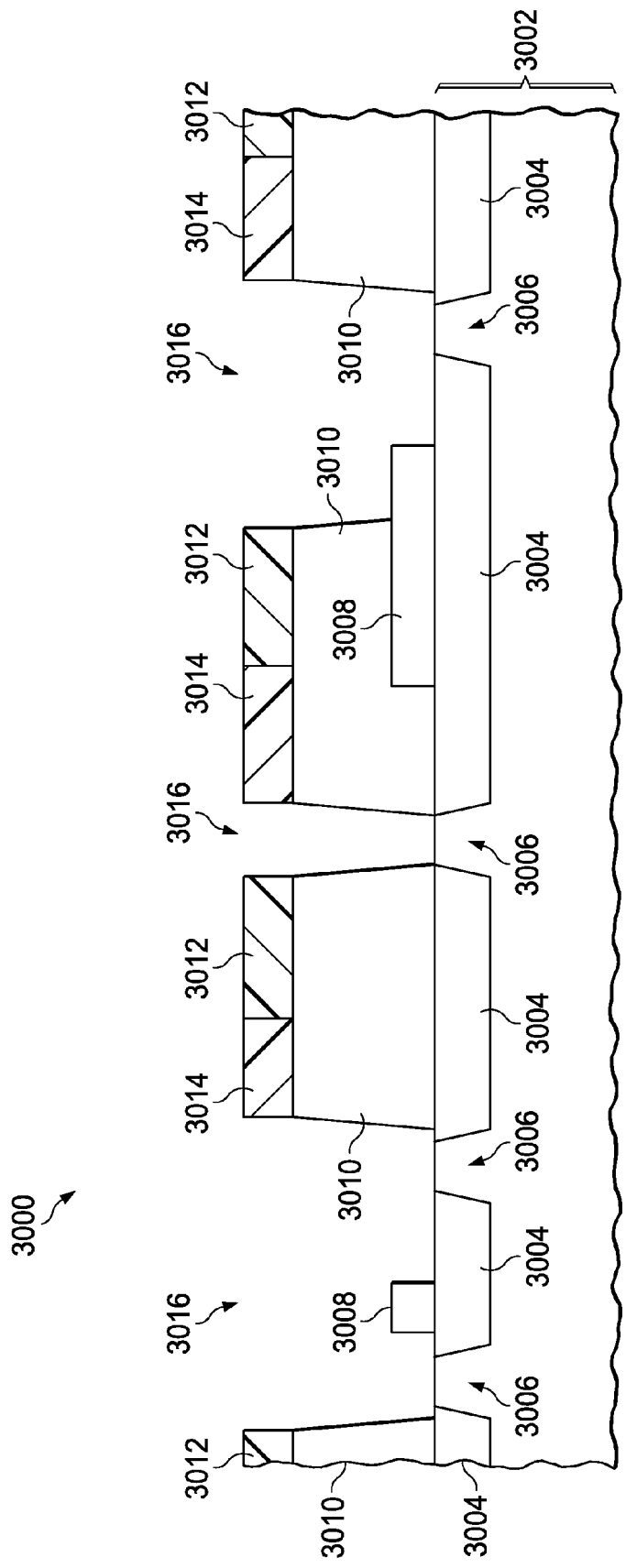

Referring to FIG. 3C, a contact etch process is performed on the integrated circuit 3000 which removes material from the PMD layer 3010 in the contact areas to form contact holes 3016. The contact etch process may be, for example, an RIE process. The first contact etch submask 3012 and the second contact etch submask 3014 may be removed after the contact etch process is completed.

Figure 3D:
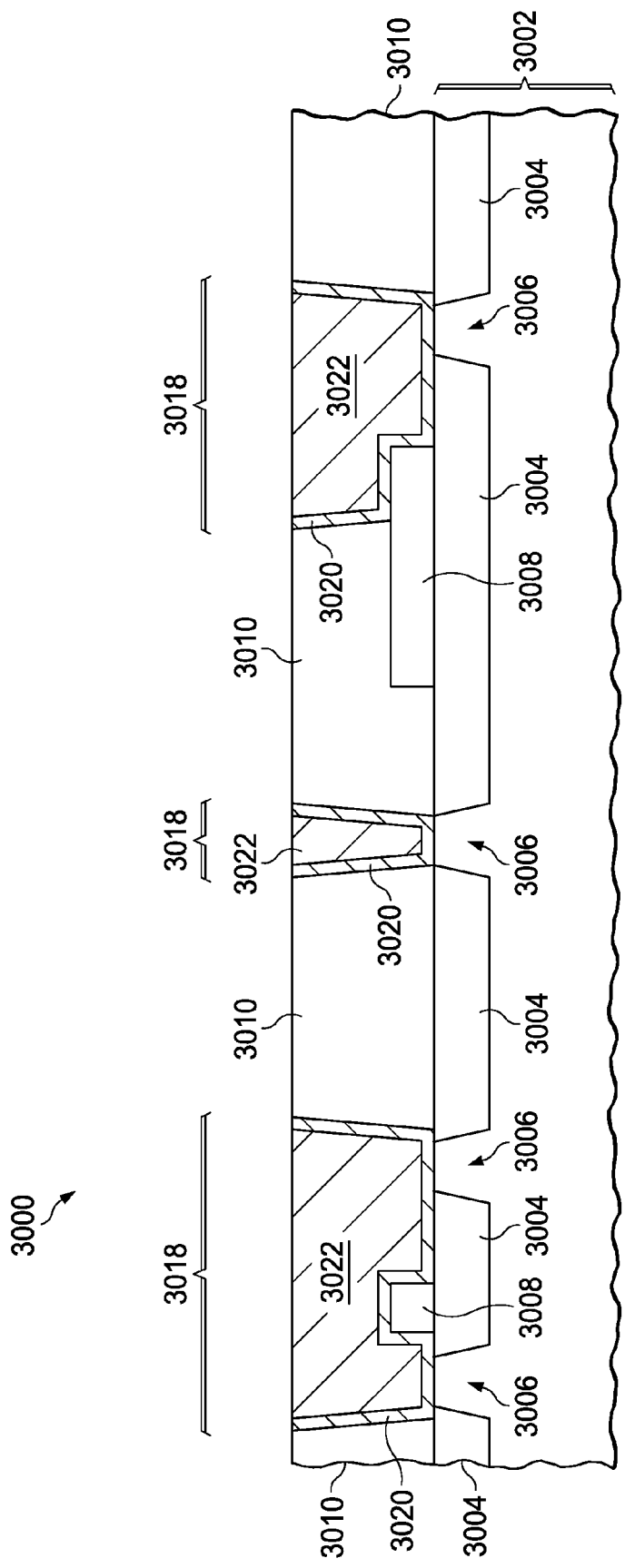

FIG. 3D depicts the integrated circuit 3000 after a contact metallization process is completed, forming contacts 3018 which include a contact metal liner 3020 and a contact fill metal 3022 as described in reference to FIG. 2E. The contacts 3018 include dual node elongated contacts which connect to exactly two active areas 3006 and/or MOS gates 3008 and which are subsequently directly connected to a first level interconnect, and multiple node elongated contacts which connect to three or more active areas 3006 and/or MOS gates 3008.

Figure 3E:
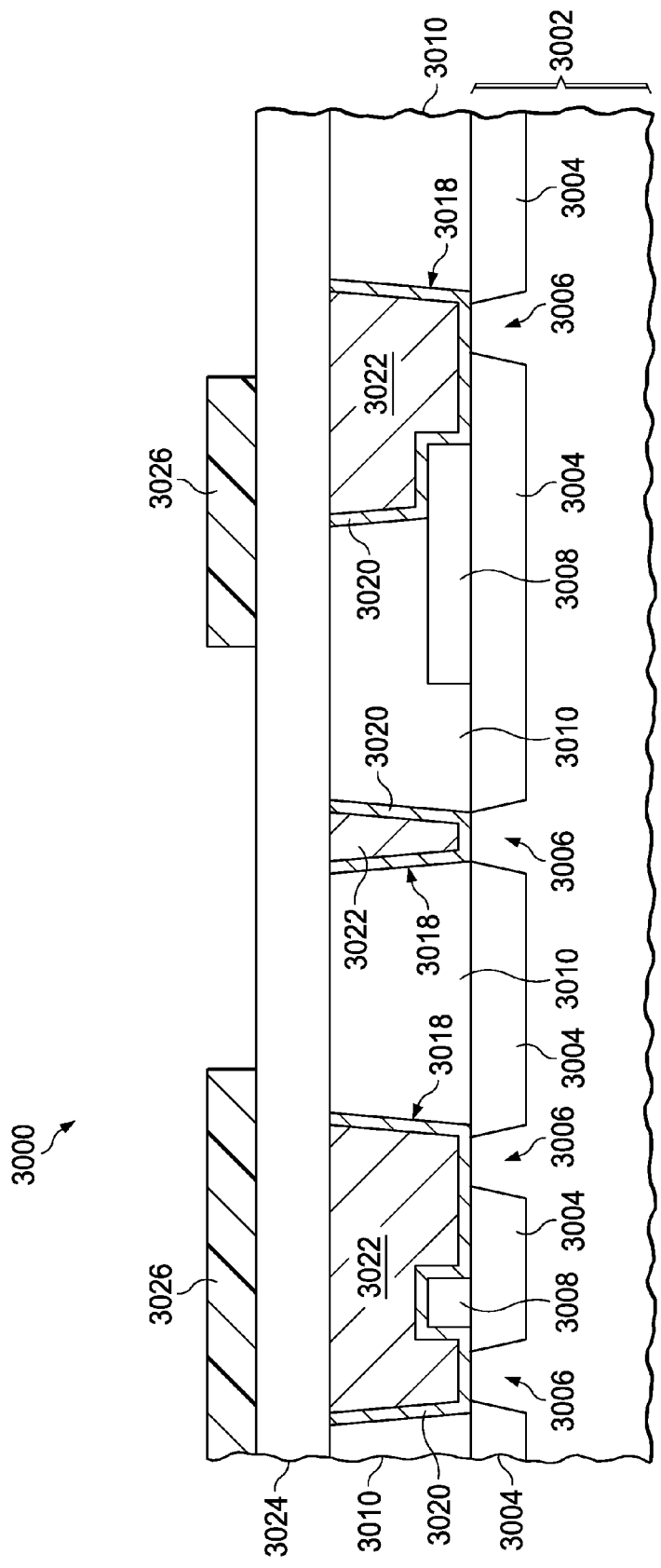

Referring to FIG. 3E, an IMD layer 3024 is formed on the PMD layer 3010 and on top surfaces of the contacts 3022. The IMD layer 3024 may have the materials and properties described in reference to FIG. 1E. A first trench etch submask 3026 is formed on the IMD layer 3024, using a process sequence similar to that described in reference to FIG. 2A. A second freeze operation is performed on a developed photoresist layer to form the first trench etch submask 3026 so that it remains intact during a subsequent process sequence to produce a second trench etch submask. Edges of the first trench etch submask 3026 form portions of boundaries of areas defined for interconnects in the integrated circuit 3000.

Figure 3F:
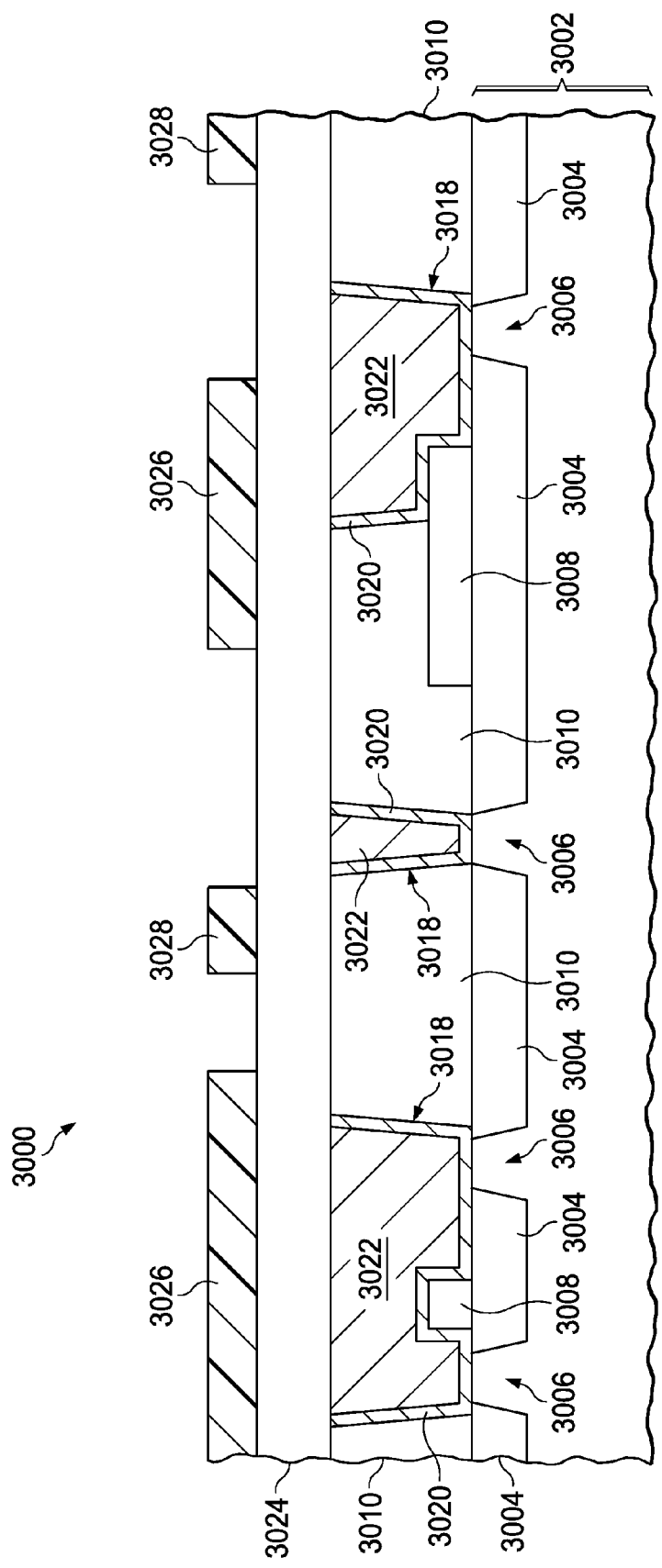

Referring to FIG. 3F, a second trench etch submask 3028 is formed on the IMD layer 3024 so that the first trench etch submask 3026 in combination with the second trench etch submask 3028 form a trench etch mask which exposes a top surface of the IMD layer 3024 in the interconnect areas. The second trench etch submask 3028 may be formed, for example, by forming a layer stack including a BARC, a photoresist layer and a friction reducing top layer, followed by exposing and developing the photoresist layer. In one version of the instant example, no additional expose and develop sequences are performed in producing the trench etch mask.

Figure 3G:
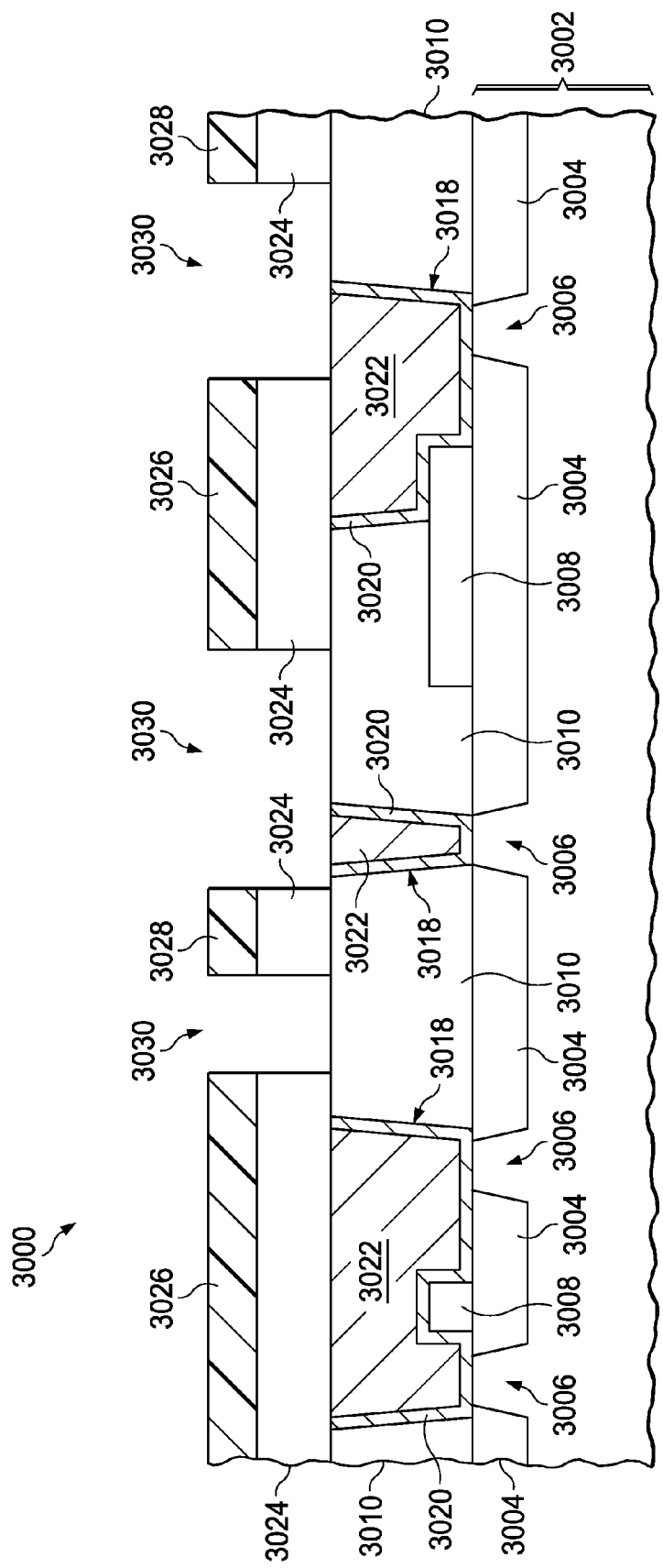

Referring to FIG. 3G, an interconnect trench etch process is performed on the integrated circuit 3000 which removes material from the IMD layer 3024 in the interconnect areas to form interconnect trenches 3030. The trench etch process uses the trench etch mask formed of the first trench etch submask 3026 in combination with the second trench etch submask 3028 as a template. Remaining material in the first trench etch submask 3026 and the second trench etch submask 3028 may be removed after the interconnect trench etch process is completed.

Figure 3H:
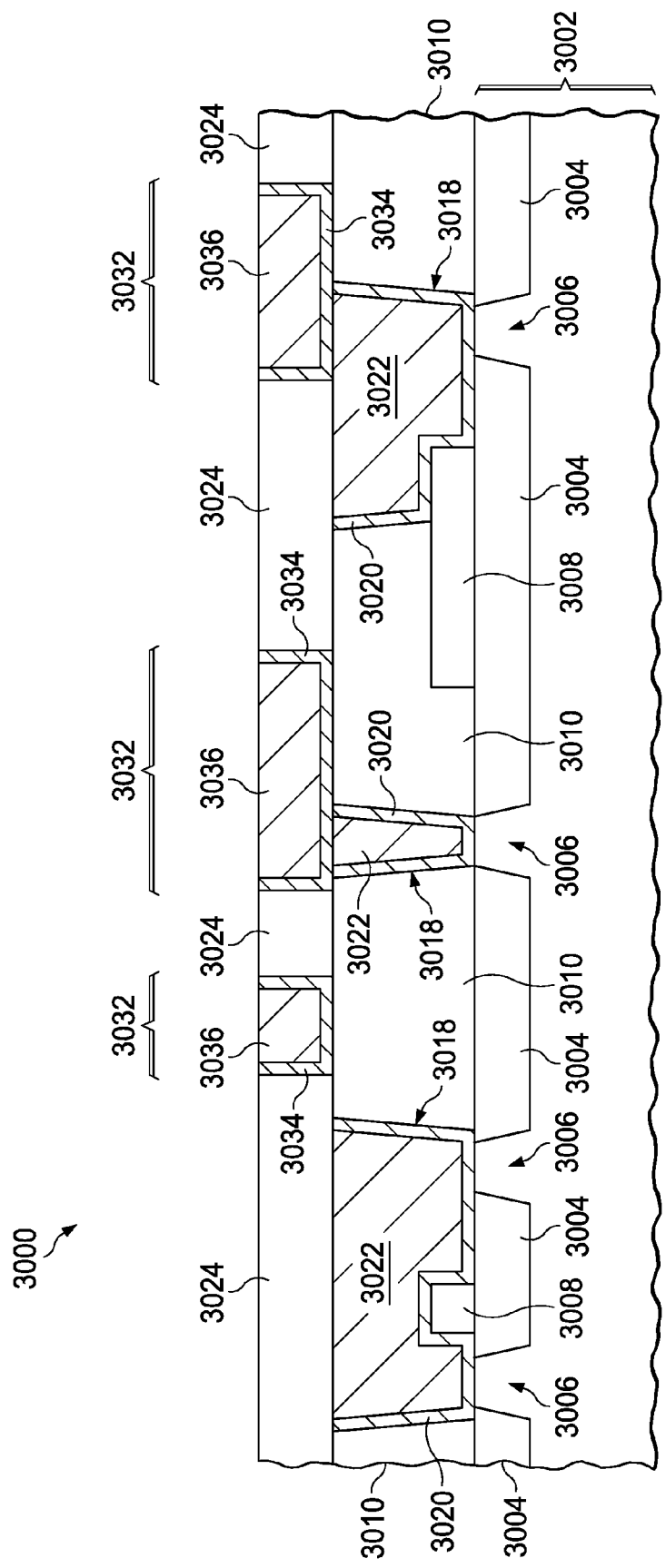

FIG. 3H depicts the integrated circuit 3000 after an interconnect metallization process is completed, forming interconnects 3032. In one version of the instant example, a layer of trench liner metal 3034 followed by a trench fill metal 3036 are formed in the trenches. The trench liner metal 3034 and the trench fill metal 3036 may be formed as described in reference to FIG. 2J. Trench liner metal and trench fill metal on the top surface of the IMD layer 3024 may be removed by CMP and/or etchback processes. Dual node elongated contacts which connect to exactly two active areas 3006 and/or MOS gates 3008 and are directly connected to a first level interconnect 3032. Additional levels of dielectric layers and interconnects are formed above the first level interconnects 3032 as described in reference to FIG. 2K.

While various examples of the present invention have been described above, it should be understood that they have been presented by way of example only and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

What is claimed is:

1. A method of forming an integrated circuit, comprising the steps:

forming elements of field oxide at a top surface of a substrate, so that regions of the substrate between the field oxide are active areas;

forming metal oxide semiconductor (MOS) transistor gates over the substrate;

forming a pre-metal dielectric (PMD) layer over the active areas and the MOS transistor gates, the PMD layer having contact areas defined for contacts;

forming a contact etch mask over the PMD layer, by a process including the steps:

forming a first contact photoresist layer over the PMD layer;

performing a first contact exposure operation on the first contact photoresist layer with a first contact subpattern;

developing the first contact photoresist layer;

performing a freeze process on the first contact photoresist layer to form a first contact etch submask of the contact etch mask;

forming a second contact photoresist layer over the PMD layer;

performing a second contact exposure operation on the second contact photoresist layer with a second contact subpattern;

developing the second contact photoresist layer to form a second contact etch submask of the contact etch mask, so that boundaries of the contact areas are formed by combined edges of the first contact etch submask and the second contact etch submask;

etching a plurality of contact holes in the PMD layer in areas defined by the contact areas;

filling the contact holes with contact metal to form a plurality of contacts, the plurality of contact including:
dual node elongated contacts which connect to exactly two active areas and/or MOS gates; and
multiple node elongated contacts which connect to three or more active areas and/or MOS gates;

forming an intra-metal dielectric (IMD) layer above the PMD layer, the IMD layer having interconnect areas defined for interconnects;

etching a plurality of interconnect trenches in the IMD layer in areas defined by the interconnect areas;

filling the interconnect trenches with interconnect metal to form a plurality of first level interconnects, so that each of the dual node elongated contacts is directly connected to at least one of the first level interconnects.

2. The method of claim 1, further including the steps:
forming a contact hard mask layer over the PMD layer prior to forming the contact etch mask; and
performing a contact hard mask etch process on the integrated circuit after forming the contact etch mask and prior to the step of etching the plurality of the contact holes in the PMD layer, so as to remove material from the contact hard mask layer in the contact areas to form contact hard mask holes, so that the step of etching the plurality of the contact holes in the PMD layer is performed using the contact hard mask layer as a template.

3. The method of claim 1, wherein the step of filling the contact holes with contact metal includes:
forming a contact liner metal in the contact holes; and
forming a contact fill metal in the contact holes.

4. The method of claim 1, wherein the step of filling the interconnect trenches with interconnect metal includes:
forming a trench liner metal in the interconnect trenches; and
forming a trench fill metal in the interconnect trenches.

5. The method of claim 1, wherein no additional expose and develop sequences are performed in forming the contact etch mask.

6. The method of claim 1, further including forming a CMOS inverter by a process including:
forming the elements of field oxide to provide an inverter p-type active area in the substrate, the inverter p-type active area including an output node;
forming the elements of field oxide to provide an inverter n-type active area in the substrate proximate to the inverter p-type active area, the inverter n-type active area including an output node;
forming an inverter MOS gate above the substrate, the inverter MOS gate crossing the inverter p-type active area and the inverter n-type active area;
forming the contact etch mask to provide an inverter output node elongated contact connecting the output node of the inverter p-type active area and the output node of the inverter n-type active area; and
forming one of the first level interconnects to be directly connected to the inverter output node elongated contact.

7. A method of forming an integrated circuit, comprising the steps:
forming elements of field oxide at a top surface of a substrate, so that regions of the substrate between the field oxide are active areas;
forming MOS transistor gates over the substrate;
forming a PMD layer over the active areas and the MOS transistor gates, the PMD layer having contact areas defined for contacts;
etching a plurality of contact holes in the PMD layer in areas defined by the contact areas;
filling the contact holes with contact metal to form a plurality of contacts, the plurality of contact including:
dual node elongated contacts which connect to exactly two active areas and/or MOS gates; and
multiple node elongated contacts which connect to three or more active areas and/or MOS gates;
forming an IMD layer above the PMD layer, the IMD layer having interconnect areas defined for interconnects;
forming a trench etch mask over the IMD layer, by a process including the steps:
forming a first trench photoresist layer over the IMD layer;
performing a first trench exposure operation on the first trench photoresist layer with a first trench subpattern;
developing the first trench photoresist layer;
performing a freeze process on the first trench photoresist layer to form a first trench etch submask of the trench etch mask, so that edges of the first trench etch submask form portions of boundaries of the interconnect areas;
forming a second trench photoresist layer over the IMD layer;
performing a second trench exposure operation on the second trench photoresist layer with a second trench subpattern;
developing the second trench photoresist layer to form a second trench etch submask of the trench etch mask, so that boundaries of the interconnect areas are formed by combined edges of the first trench etch submask and the second trench etch submask;
etching a plurality of interconnect trenches in the IMD layer in areas defined by the interconnect areas;
filling the interconnect trenches with interconnect metal to form a plurality of first level interconnects, so that each of the s dual node elongated contacts is directly connected to at least one of the first level interconnects.

8. The method of claim 7, further including the steps:
forming an interconnect hard mask layer over the IMD layer prior to forming the trench etch mask; and
performing an interconnect hard mask etch process on the integrated circuit after forming the trench etch mask and prior to the step of etching the plurality of the interconnect trenches in the IMD layer, so as to remove material from the interconnect hard mask layer in the interconnect areas to form interconnect hard mask holes, so that the step of etching the plurality of the interconnect trenches in the IMD layer is performed using the interconnect hard mask layer as a template.

9. The method of claim 7, wherein the step of filling the interconnect trenches with interconnect metal includes:
forming a trench liner metal in the interconnect trenches; and
forming a trench fill metal in the interconnect trenches.

10. The method of claim 7, wherein no additional expose and develop sequences are performed in forming the trench etch mask.

11. The method of claim 7, wherein:
the first trench exposure operation is performed using photolithography equipment which has a spatial resolution limit; and
some members of the interconnect areas are separated by less than the spatial resolution limit.

12. The method of claim 7, further including forming a CMOS inverter by a process including:
- forming the elements of field oxide to provide an inverter p-type active area in the substrate, the inverter p-type active area including an output node;
- forming the elements of field oxide to provide an inverter n-type active area in the substrate proximate to the inverter p-type active area, the inverter n-type active area including an output node;
- forming an inverter MOS gate above the substrate, the inverter MOS gate crossing the inverter p-type active area and the inverter n-type active area;
- forming the dual node elongated contacts to provide an inverter output node elongated contact connecting the output node of the inverter p-type active area and the output node of the inverter n-type active area; and
- forming the contact etch mask so that one of the first level interconnects is directly connected to the inverter output node elongated contact.

13. A method of forming an integrated circuit, comprising the steps:
- forming elements of field oxide at a top surface of a substrate, so that regions of the substrate between the field oxide are active areas;
- forming MOS transistor gates over the substrate;
- forming a PMD layer over the active areas and the MOS transistor gates, the PMD layer having contact areas defined for contacts;
- forming a contact etch mask over the PMD layer, by a process including the steps:
  - forming a first contact photoresist layer over the PMD layer;
  - performing a first contact exposure operation on the first contact photoresist layer with a first contact subpattern;
  - developing the first contact photoresist layer;
  - performing a freeze process on the first contact photoresist layer to form a first contact etch submask of the contact etch mask, so that edges of the first contact etch submask form portions of boundaries of the contact areas;
  - forming a second contact photoresist layer over the PMD layer while the first contact etch submask remains on the PMD layer;
  - performing a second contact exposure operation on the second contact photoresist layer with a second contact subpattern;
  - developing the second contact photoresist layer to form a second contact etch submask of the contact etch mask, so that boundaries of the contact areas are formed by combined edges of the first contact etch submask and the second contact etch submask;
- etching a plurality of contact holes in the PMD layer in areas defined by the contact areas;
- filling the contact holes with contact metal to form a plurality of contacts, the plurality of contact including:
  - dual node elongated contacts which connect to exactly two active areas and/or MOS gates; and
  - multiple node elongated contacts which connect to three or more active areas and/or MOS gates;
- forming an IMD layer above the PMD layer, the IMD layer having interconnect areas defined for interconnects;
- forming a trench etch mask over the IMD layer, by a process including the steps:
  - forming a first trench photoresist layer over the IMD layer;
  - performing a first trench exposure operation on the first trench photoresist layer with a first trench subpattern;
  - developing the first trench photoresist layer;
  - performing a freeze process on the first trench photoresist layer to form a first trench etch submask of the trench etch mask, so that edges of the first trench etch submask form portions of boundaries of the interconnect areas;
  - forming a second trench photoresist layer over the IMD layer while the first trench etch submask remains over the IMD layer;
  - performing a second trench exposure operation on the second trench photoresist layer with a second trench subpattern;
  - developing the second trench photoresist layer to form a second trench etch submask of the trench etch mask, so that boundaries of the interconnect areas are formed by combined edges of the first trench etch submask and the second trench etch submask;
- etching a plurality of interconnect trenches in the IMD layer in areas defined by the interconnect areas;
- filling the interconnect trenches with interconnect metal to form a plurality of first level interconnects, so that each of the dual node elongated contacts is directly connected to at least one of the first level interconnects.

14. The method of claim 13, further including the steps:
- forming a contact hard mask layer over the PMD layer prior to forming the contact etch mask; and
- performing a contact hard mask etch process on the integrated circuit after forming the contact etch mask and prior to the step of etching the plurality of the contact holes in the PMD layer, so as to remove material from the contact hard mask layer in the contact areas to form contact hard mask holes, so that the step of etching the plurality of the contact holes in the PMD layer is performed using the contact hard mask layer as a template.

15. The method of claim 13, further including the steps:
- forming an interconnect hard mask layer over the IMD layer prior to forming the trench etch mask; and
- performing an interconnect hard mask etch process on the integrated circuit after forming the trench etch mask and prior to the step of etching the plurality of the interconnect trenches in the IMD layer, so as to remove material from the interconnect hard mask layer in the interconnect areas to form interconnect hard mask holes, so that the step of etching the plurality of the interconnect trenches in the IMD layer is performed using the interconnect hard mask layer as a template.

16. The method of claim 13, wherein the step of filling the contact holes with contact metal includes:
- forming a contact liner metal in the contact holes; and
- forming a contact fill metal in the contact holes.

17. The method of claim 13, wherein the step of filling the interconnect trenches with interconnect metal includes:
- forming a trench liner metal in the interconnect trenches; and
- forming a trench fill metal in the interconnect trenches.

18. The method of claim 13, wherein:
- the first contact exposure operation is performed using photolithography equipment which has a spatial resolution limit; and
- some members of the contact areas are separated by less than the spatial resolution limit.

19. The method of claim 13, wherein:
- the first trench exposure operation is performed using photolithography equipment which has a spatial resolution limit; and some members of the interconnect areas are separated by less than the spatial resolution limit.

20. The method of claim 13, further including forming a CMOS inverter by a process including:
- forming the elements of field oxide to provide an inverter p-type active area in the substrate, the inverter p-type active area including an output node;
- forming the elements of field oxide to provide an inverter n-type active area in the substrate proximate to the inverter p-type active area, the inverter n-type active area including an output node;
- forming an inverter MOS gate above the substrate, the inverter MOS gate crossing the inverter p-type active area and the inverter n-type active area;
- forming the contact etch mask to provide an inverter output node elongated contact connecting the output node of the inverter p-type active area and the output node of the inverter n-type active area; and
- forming the contact etch mask so that one of the first level interconnects is directly connected to the inverter output node elongated contact.

\* \* \* \* \*